(12) United States Patent
Tanaka

(10) Patent No.: US 6,949,755 B2
(45) Date of Patent: Sep. 27, 2005

(54) POSITION DETECTION APPARATUS, POSITION DETECTION METHOD, EXPOSURE APPARATUS, DEVICE MANUFACTURING METHOD, AND SUBSTRATE

(75) Inventor: Hiroshi Tanaka, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/446,693

(22) Filed: May 29, 2003

(65) Prior Publication Data
US 2003/0235330 A1 Dec. 25, 2003

(30) Foreign Application Priority Data
May 31, 2002 (JP) .......................... 2002/160299

(51) Int. Cl.⁷ .......................... H01J 37/304; G21G 5/00
(52) U.S. Cl. .................. 250/491.1; 250/492.2; 250/492.3
(58) Field of Search ................ 250/491.1, 492.2, 250/492.3; 355/53

(56) References Cited

U.S. PATENT DOCUMENTS

| | | | | |
|---|---|---|---|---|
| 5,140,366 A | * | 8/1992 | Shiozawa et al. | 355/53 |
| 5,148,214 A | * | 9/1992 | Ohta et al. | 355/43 |
| 5,249,016 A | | 9/1993 | Tanaka | 355/53 |
| 5,543,921 A | | 8/1996 | Uzawa et al. | 356/401 |
| 5,552,611 A | * | 9/1996 | Enichen | 250/491.1 |
| 5,695,897 A | | 12/1997 | Mitome et al. | 430/22 |
| 5,774,575 A | | 6/1998 | Tanaka et al. | 382/149 |
| 2002/0036777 A1 | | 3/2002 | Tanaka | 356/401 |
| 2002/0154283 A1 | | 10/2002 | Tanaka et al. | 355/53 |
| 2003/0053040 A1 | | 3/2003 | Hayashi et al. | 355/55 |
| 2003/0053058 A1 | | 3/2003 | Tanaka | 356/401 |
| 2003/0053059 A1 | | 3/2003 | Mishima et al. | 356/401 |

* cited by examiner

Primary Examiner—John R. Lee
Assistant Examiner—Paul M. Gurzo
(74) Attorney, Agent, or Firm—Fitzpatrick, Cella, Harper & Scinto

(57) ABSTRACT

An apparatus which detects a position of a target mark included in an object. The apparatus includes a unit which senses an image of the object, a unit which extracts a first mark and a feature of a region outside of the first mark in the image, and a unit which detects a position of the target mark based on a position of the first mark and the feature.

13 Claims, 22 Drawing Sheets

F I G. 5B
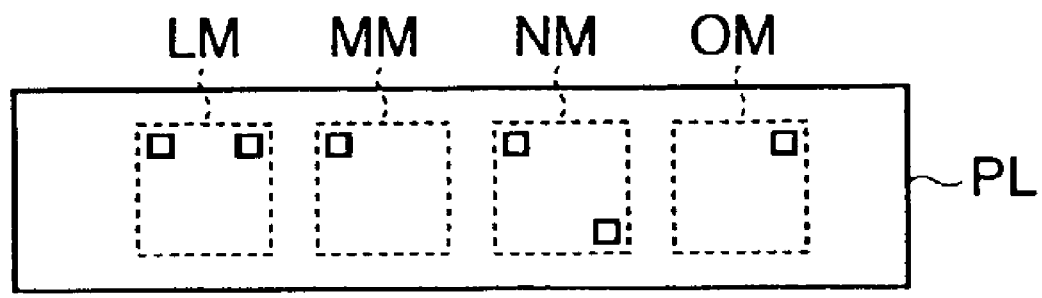

POSITION DETECTION APPARATUS, POSITION DETECTION METHOD, EXPOSURE APPARATUS, DEVICE MANUFACTURING METHOD, AND SUBSTRATE

FIELD OF THE INVENTION

The present invention relates to a position detection apparatus and position detection method, an exposure apparatus, a device manufacturing method, and a substrate and, more particularly, to a position detection apparatus and position detection method which detect the position of a mark on an object, an exposure apparatus including the apparatus, a device manufacturing method using the apparatus, and a substrate adapted to such a position detection apparatus.

BACKGROUND OF THE INVENTION

A semiconductor device is manufactured by repeating a lithography step for projecting and exposing a device pattern formed on a master (e.g., a reticle or mask) to a substrate (e.g., a wafer or glass substrate) coated with a photosensitive material and developing the device pattern. In such a manufacturing step, it is important to accurately align a device pattern (latent image) to be projected and exposed to a photosensitive material to a device pattern (patterned structure) already formed on a substrate.

An example of operation for aligning the pattern of a master to a pattern formed on a substrate is substrate alignment. In the manufacturing step of forming a semiconductor device on a wafer, such substrate alignment is called wafer alignment.

Wafer alignment is performed in accordance with the following procedure. First, a wafer is supplied to a lithography system having an exposure apparatus and a mechanical alignment apparatus. Coarse alignment is done by the mechanical alignment apparatus using an orientation flat or notch formed at the peripheral portion of the wafer. Then, the wafer is placed on the wafer chuck of the exposure apparatus by a wafer supply apparatus. The typical alignment accuracy by the mechanical alignment apparatus is about 20 μm.

Next, the positions of a plurality of alignment marks (position detection marks) formed on the wafer by a preceding step are detected using an alignment scope. The X- and Y-direction shifts and rotation component of the wafer and the magnification component of the shot array are calculated on the basis of the detection result. In exposing each shot, the wafer stage is driven on the basis of the calculation result. Accordingly, the pattern already formed in a shot is accurately aligned to the pattern projected onto the wafer through a projecting optical system. This scheme will be called global alignment. The accuracy of global alignment is 50 nm or less in an exposure apparatus for manufacturing, e.g., a 256-Mbit memory.

In recent years, a planarization technique by a polishing step called CMP (Chemical Mechanical Polishing) is often used. When CMP is executed, the layer on the alignment mark is polished. This degrades a mark signal or decreases stability. To prevent this, an alignment mark is often optimized in accordance with the process. This optimization is performed by forming a plurality of tentative alignment marks having different structures such as line widths, pitches, and three-dimensional patterns and selecting an optimum alignment mark. Normally, an optimum alignment mark is determined at the time of prototype formation. In a flexible manufacturing system, however, mass production sometimes starts without executing optimization. In this case, a plurality of alignment marks may enter the visual field of the alignment scope.

Additionally, in recent years, a method of forming a plurality of sets of alignment marks in one region (exposure region) is replacing a method of forming a set of X and Y alignment marks in one region. This aims at, e.g., correcting a deformation of the exposure region or increasing the measurement accuracy by an averaging effect obtained by measuring a plurality of alignment marks. For such purposes, the accuracy must be increased by ensuring the span between the alignment marks is as wide as possible. More specifically, four alignment marks are formed at the four corners of each exposure region. Also, with this background, a plurality of alignment marks may enter the visual field (the field of view) of an alignment scope at a high probability.

Furthermore, as the number of steps increases recently along with an increase in complexity of a device structure, the number of times of alignment mark formation increases.

More specifically, the number or layout density of alignment marks increases in recent years in accordance with various purposes or factors such as optimization of the alignment mark structure, improvement of measurement accuracy, and the increase in the number of steps. Accordingly, a plurality of alignment marks enter the visual field of an alignment scope. For this reason, the necessity for identifying or specifying a target alignment mark from a plurality of alignment marks in the visual field is increasing.

SUMMARY OF THE INVENTION

The present invention has been made in consideration of the above situation, and has as its object to obtain a position of a target mark from an image of an object including a plurality of marks.

According to the first aspect of the present invention, there is provided an apparatus which detects a position of a mark included in an object. The apparatus comprises a unit which senses an image of the object, wherein a plurality of marks included in the object can be included in the image, a unit which extracts a feature of a region, other than a region of a target mark of the plurality of marks, of the image sensed by the sensing unit, and a unit which calculates a position of the target mark based on the feature extracted by the extracting unit.

In the preferred embodiment of the present invention, the feature may correspond to an auxiliary mark, included in the object, associated with one of the plurality of marks. The auxiliary mark can be connected to one of the plurality of marks. The auxiliary mark can be associated with the target mark or one of the plurality of marks other than the target mark.

In the preferred embodiment, the feature may correspond to relative positions of some of the plurality of marks or a position of one of the plurality of marks, of which a position relative to the target mark is known.

In the preferred embodiment, the object may include a substrate on which a device is to be formed.

In the preferred embodiment, the apparatus can further comprise a stage unit which positions the substrate. In such an application, the apparatus can further comprise a unit which controls positioning of the substrate by the stage unit based on the position of the target mark calculated by the calculating unit.

According to the second aspect of the present invention, there is provided an apparatus which exposes a substrate to radiant energy. The apparatus comprises a stage unit which positions the substrate, a unit which senses an image of the substrate, wherein a plurality of marks included in the substrate can be included in the image, a unit which extracts a feature of a region, other than a region of a target mark of the plurality of marks, of the image sensed by the sensing unit, a unit which calculates a position of the target mark based on the feature extracted by the extracting unit, and a unit which controls positioning of the substrate by the stage unit based on the position of the target mark calculated by the calculating unit.

According to the third aspect of the present invention, there is provided an apparatus which exposes a substrate to radiant energy. The apparatus comprises a unit which projects a pattern of radiant energy to the substrate, a unit which holds a mask having an auxiliary pattern, to be projected by the projecting unit, for identifying a target mark formed on the substrate, and a unit which controls an operation of projecting the auxiliary pattern by the projecting unit.

According to the fourth aspect of the present invention, there is provided a substrate comprising a region for a chip and a plurality of marks formed such that a position of a target mark of the plurality of marks is recognized.

According to the fifth aspect of the present invention, there is provided a method of detecting a position of a mark included in an object. The method comprises steps of sensing an image of the object, wherein a plurality of marks included in the object can be included in the image, extracting a feature of a region, other than a region of a target mark of the plurality of marks, of the image sensed in the sensing step, and calculating a position of the target mark based on the feature extracted in the extracting step.

According to the sixth aspect of the present invention, there is provided a method of manufacturing a device, the method comprising steps of sensing an image of a substrate, wherein a plurality of marks included in the substrate can be included in the image, extracting a feature of a region, other than a region of a target mark of the plurality of marks, of the image sensed in the sensing step, calculating a position of the target mark based on the feature extracted in the extracting step, and transferring a pattern concerning the device to the substrate based on the position of the target mark calculated in the calculating step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 5B is a view for explaining the auxiliary pattern transfer function;

DETAILED DESCRIPTION OF THE PREFERRED EMBODIMENTS

Preferred embodiments of the present invention will be described below with reference to the accompanying drawings.

[First Embodiment]

An example of an alignment mark (position detection mark) to be used in the global alignment in a lithography system or an exposure apparatus according to a preferred embodiment of the present invention will be described first with reference to FIG. 8A. An alignment mark FXY of this embodiment is designed to make it possible to simultaneously execute measurement in the X direction and that in the Y direction in global alignment.

Figure 8A:
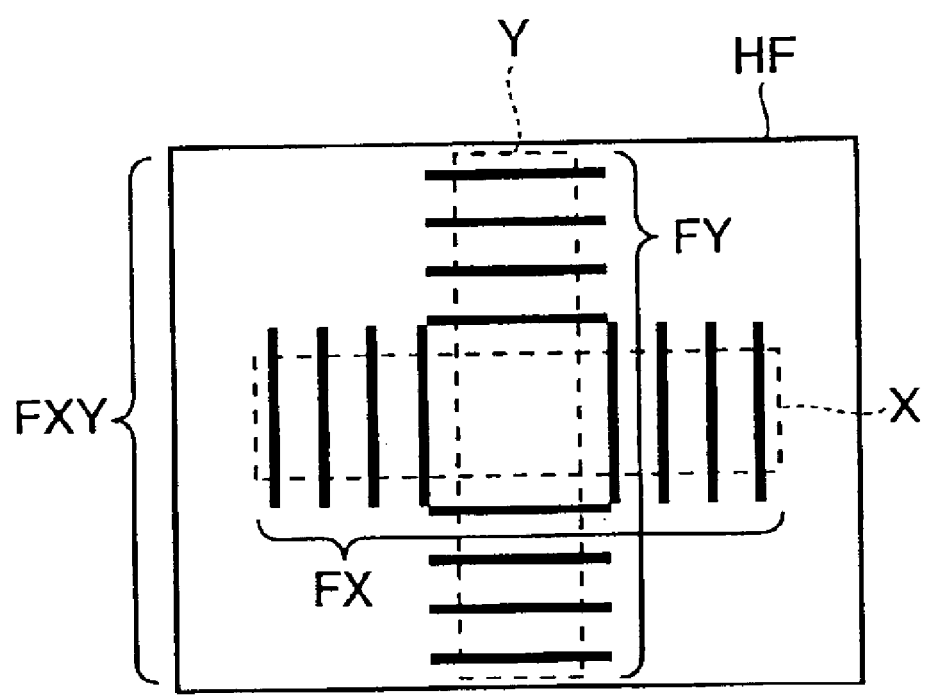
FIG. 8A is a view showing an arrangement example of an alignment mark.

In global alignment, a mark FX for X-direction measurement in a window X shown in FIG. 8A is observed with a high-magnification scope (high-magnification detection system or high-magnification observation system). Simultaneously, a mark FY for Y-direction measurement in a window Y is observed with a high-magnification scope. With this operation, the X- and Y-direction positions (coordinates) of the alignment mark FXY are detected at a high resolution.

Global alignment according to the preferred embodiment of the present invention will be described next with reference to FIGS. 1 and 4. When a wafer is supplied to a lithography system shown in FIG. 1 by a transfer mechanism (not shown), a mechanical alignment apparatus MA determines the coarse petition of the wafer on the basis of the peripheral position of the wafer and the position of a direction specifying portion (N in FIG. 4), called an orientation flat or notch.

Next, the wafer is placed on a chuck CH mounted on a wafer stage STG by a wafer supply apparatus (not shown). After that, global alignment is performed to accurately obtain the position of the wafer W and the position of each exposure shot. In the global alignment according to this embodiment, X-direction measurement marks FX1 to FX4 and Y-direction measurement marks FY1 to FY4 in a plurality of global alignment marks FXY1 to FXY4 on the wafer W are measured using a high-magnification scope (high-magnification detection system or high-magnification observation system), thereby obtaining the X- and Y-direction shifts and rotation component of the wafer W from the reference position and the magnification component of the shot array.

An alignment scope which can observe the alignment mark FXY shown in FIG. 8A simultaneously with a low-magnification system and high-magnification system will be described next. A microscope for wafer alignment, i.e., an alignment scope SC shown in FIG. 1 is designed to make it possible to observe an alignment mark simultaneously with a low-magnification system and high-magnification system to detect the position of the alignment mark.

Alignment mark illumination light is guided from an alignment mark illumination light source Li into the scope SC, passes through a half mirror M1 (or a polarizing beam splitter), and illuminates an alignment mark (e.g., the mark FXY1 shown in FIG. 4) on the wafer W. Reflected light from the wafer W passes through the half mirror M1 and a half mirror M2 and reaches a high-magnification detection sensor (e.g., a photoelectric conversion element) S2. Simultaneously, the reflected light from the wafer W also passes through the half mirrors M1 and M2 and reaches a low-magnification detection sensor (e.g., a photoelectric conversion element) S1. Images sensed by the sensors S1 and S2 are supplied to a processing apparatus P. The processing apparatus P executes a predetermined process to calculate the position of the alignment mark.

Calculation of the alignment mark position is done for each of the two sensors S1 and S2 of the low- and high-magnification systems. An electrical signal (image signal.) photoelectrically converted by the low-magnification system detection sensor S1 is converted from an analog signal into a digital signal by an A/D converter AD1 and then stored in an image memory MEM1 as image data. An arithmetic device COM1 searches for the alignment mark FXY (FX and FY) while executing a pattern matching process or the like for the image data in the image memory MEM1.

Figure 2A:
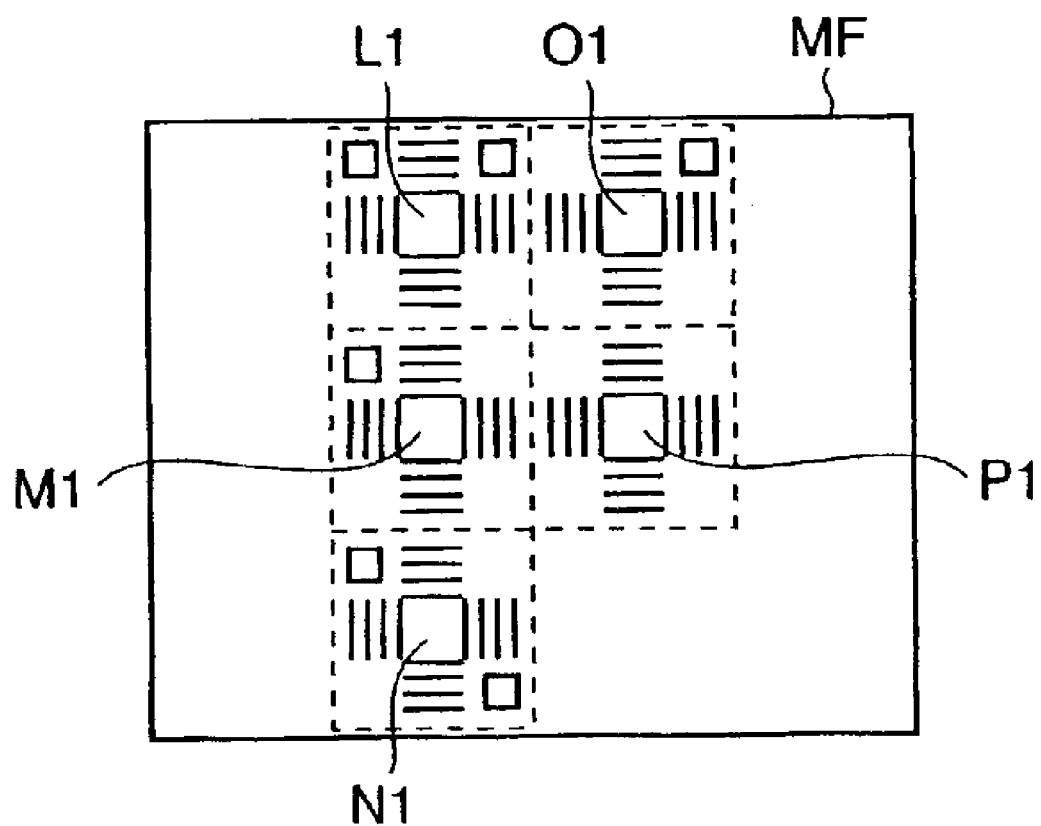
FIG. 2A is a view showing an example of a group of alignment marks observed in a low-magnification visual field.
Figure 2B:
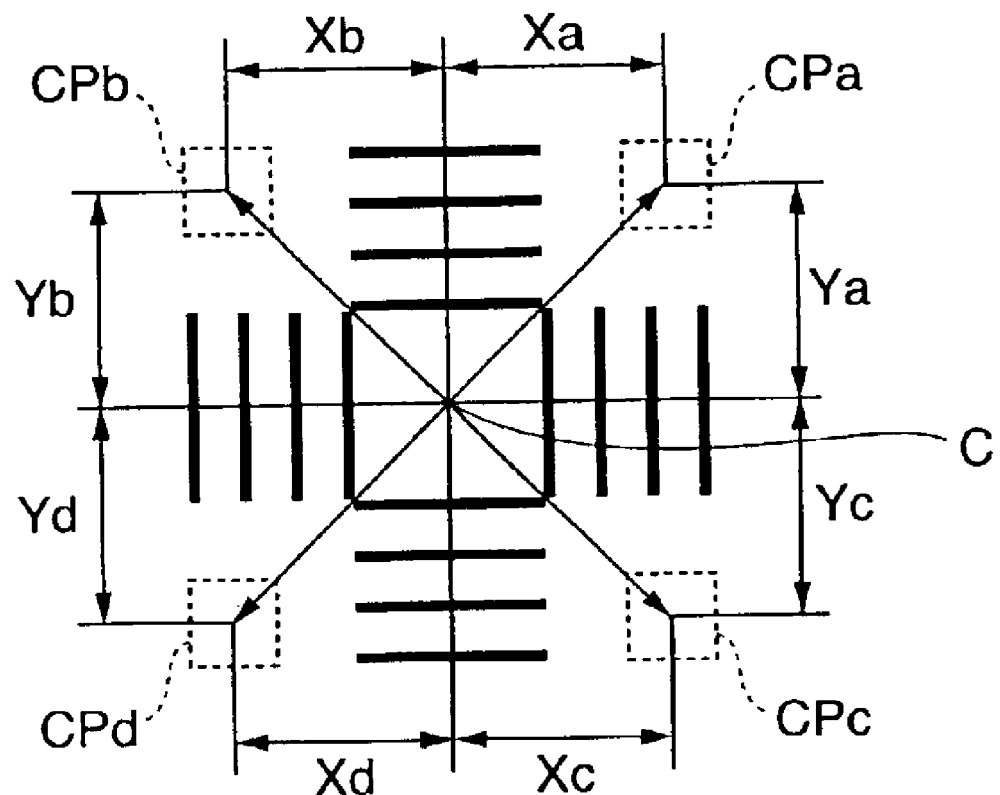
FIG. 2B is a view for explaining auxiliary patterns used to identify a target alignment mark.

A template for pattern matching can be constituted by a two-dimensional pattern formed from, e.g., eight vertical lines and eight horizontal lines, as shown in FIG. 2B by example. The matching process algorithm of template matching is designed such that not only a mark that strictly has the same shape as that of the template but also a mark whose line width or the like is different from that of a standard mark can be detected. More specifically, the mark detection algorithm allows detection of all marks even when a mark which has a shape similar to that of the template (shape with a common feature portion to be detected), although its structure such as a line width or mark step is different, is present in the image stored in the image memory MEM1, i.e., in the low-magnification visual field as well as marks having the same shape as that of the template.

In addition, when two templates are prepared, marks that are classified into two types, e.g., a mark having eight vertical lines and eight horizontal lines, as shown in FIG. 2B as a characteristic feature, and a mark (not shown) having six vertical lines and six horizontal lines as a characteristic feature can be detected. Furthermore, when a plurality of templates are prepared, marks that are classified into types equal in number to the templates can be detected.

To detect alignment marks, various methods except template matching and pattern matching can also be applied.

The reflected light for the high-magnification system can be made different from that for the low-magnification system by using the common illumination light source Li and adjusting the accumulation times in the sensors S1 and S2.

The principle of mark observation performed using the high-magnification system (M1, M2, and S2) and low-magnification system (M1 and S1) simultaneously will be described next with reference to FIGS. 8A and 8B. FIG. 8A illustrates an observable visual field HF of the high-magnification system (M1, M2, and S2). For both the X-direction pattern FX and the Y-direction pattern FY, shifts with respect to the windows X and Y are hardly allowed.

Figure 8B:
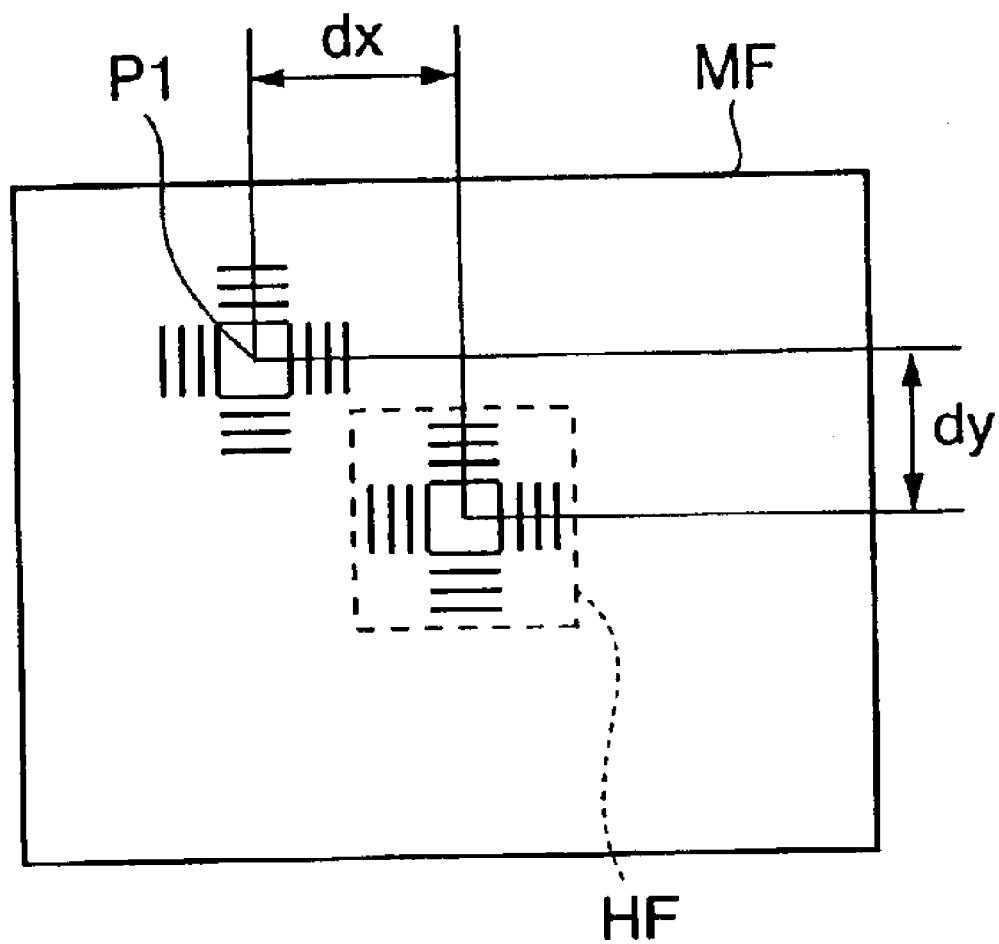
FIG. 8B is a view schematically showing a situation in which an alignment mark is moved into the visual field of a high-magnification sensor.
Figure 8C:
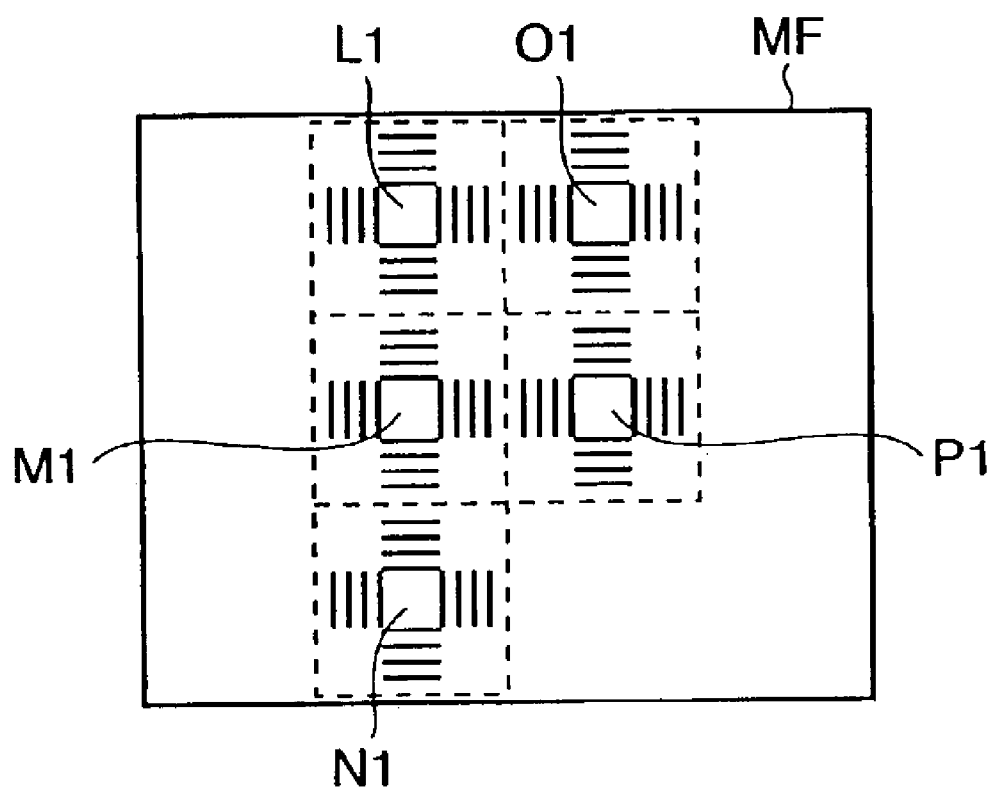
FIG. 8C is a view showing a group of alignment marks in the visual field of a low-magnification sensor.

FIG. 8B illustrates an observable visual field MF of the low-magnification system (M1 and S1). The visual field MF of the low-magnification system is wider than the visual field HF of the high-magnification system. The arithmetic device COM1 calculates small moving amounts dx and dy of the wafer W which should be moved to put an alignment mark P1 to be detected into the visual field HF of the high-magnification system on the basis of the alignment mark observation result (the position of the alignment mark to be detected) by the low-magnification system (M1 and S1) while observing the alignment mark simultaneously with the high-magnification system and low-magnification system.

High-speed wafer alignment using the alignment marks shown in FIGS. 2A and 2B and the alignment scope SC shown in FIG. 1 will be described next as the preferred embodiment of the present invention. The light component that has passed through the half mirror M2 is guided to the sensor S2 of the high-magnification system and forms the image of the alignment mark FXY on the image sensing surface of the sensor S2. In addition, the light component reflected by the half mirror M2 is guided to the sensor S1 of the low-magnification system and forms the image of the alignment mark FXY on the image sensing surface of the photoelectric conversion element S1.

It is preferable to simultaneously form the images of the alignment mark FXY and simultaneously observe the alignment mark FXY. The reason for this will be described below. If the shift amounts dx and dy shown in FIG. 8B, which are obtained by the low-magnification system, fall within an allowable range, the image of the alignment mark FXY that allows accurate position measurement is formed on the high-magnification system sensor S2. Hence, the position detection result for the alignment mark FXY using the high-magnification system sensor S2 is valid.

The allowable range means, in the example shown in FIG. 8A, shift amounts with which it is determined that the pattern FX (pattern formed from eight lines) in the X direction and the pattern FY (pattern formed from eight lines) in the Y direction are present within the windows X and Y, respectively. Hence, when the shift amounts dx and dy obtained by the low-magnification system fall within the allowable range, an accurate detection result (mark position) in the high-magnification system can be obtained as quickly as possible. Conversely, when the shift amounts dx and dy obtained by the low-magnification system fall outside the allowable range, the stage STG is finely moved by dx and dy. After that, the mark position is detected again by the high-magnification system.

A mark identification method to be used when a plurality of alignment marks having identical or similar shapes (shapes with a common feature portion to be detected) are present in the visual field MF of the low-magnification system will be described next with reference to FIG. 2A. A description will be made below assuming that the alignment mark (i.e., the target alignment mark) to be detected in the current lithography step (current exposure step) is P1.

When alignment was executed even in the preceding lithography step before the current lithography step (e.g., when the current exposure step is the exposure step of a second or subsequent time), for example, alignment marks L1, M1, NI, and O1 that were formed and used in the preceding step and have the same shape as that of the alignment mark P1 may be laid out adjacent to the current target alignment mark P1. Alternatively, the alignment marks L1, M1, NI, O1, and P1 may be marks which have similar shapes (i.e., shapes with a common feature portion to be detected), but different line widths and three-dimensional patterns for the purpose of optimizing the alignment mark structure.

In this embodiment, to detect only the current target alignment mark P1 from the visual field MF of the low-magnification system and to obtain the shift amounts dx and dy (moving amounts for observation with the high-magnification system), some or all of auxiliary patterns CPa, CPb, CPC, and CPd or no auxiliary patterns are added to regions that do not influence the measurement of the alignment mark FXY at a high magnification, as shown in FIG. 2B, thereby identifying the target alignment mark. For example, no auxiliary pattern is added to the alignment mark P1 while a small square is added to the upper right portion of the alignment mark O1.

In this way, auxiliary patterns are added to regions that do not influence high-magnification measurement in the formation regions of the alignment marks L1, M1, N1, O1, and P1 to identify the alignment marks L1, M1, N1, O1, and P1. An auxiliary pattern is preferably formed in a region outside a chip region where a device pattern (e.g., a circuit pattern) is formed and, typically, between chip regions.

The target alignment mark can also be identified on the basis of the positional relationship relative to a feature portion (e.g., a portion having an extractable feature) of a device pattern. In this case, however, a pattern that is much more complex than an alignment mark must generally be detected as an auxiliary pattern, resulting in a high arithmetic process load.

In this case, the auxiliary pattern is inevitably part of the pattern of the device to be manufactured. Hence, the template to be used to determine the target alignment mark depends on the pattern of each device to be manufactured.

Furthermore, in this case, no auxiliary pattern can be determined if, for example, device patterns around a group of alignment marks are uniform patterns having no feature portion or periodical patterns. That is, to use a pattern in a chip region as an auxiliary pattern is greatly restricted and is therefore undesirable.

Hence, as described above, an auxiliary pattern is preferably formed on purpose (i.e., the auxiliary pattern is not inevitably formed as a pattern in a chip region but formed mainly for the purpose of identifying an alignment mark) in a region outside a chip region (i.e., a region where formation of a mark or pattern for position detection is allowed).

A method of discriminately a plurality of alignment marks using auxiliary patterns will be described next with to FIGS. 2A and 2B. When alignment marks in the state as shown in FIG. 2A are present in the visual field MF of the low-magnification system (M1 and S1), the positions of the five alignment marks are detected by the arithmetic device COM1 for the low magnification. A control apparatus MC determines the presence/absence of the auxiliary patterns CPa, CPb, CPc, and CPd shown in FIG. 2B for each of the five detected positions.

The presence/absence of an auxiliary pattern can be determined by a method of, e.g., executing template matching or analyzing a contrast change using a histogram or the like for each of the regions (in this embodiment, the four corners of a rectangular region defined for alignment mark formation) where auxiliary patterns are to be formed.

The auxiliary patterns may be separated from a center C of the alignment mark equidistantly or by different distances. In the example shown in FIG. 2B, the center C is assumed to be the origin (reference position). The coordinates of the auxiliary pattern CPa are defined as (Xa,Ya). The coordinates of the auxiliary pattern CPb are defined as (-Xb,Yb). The coordinates of the auxiliary pattern CPc are defined as (Xc, -Yc). The coordinates of the auxiliary pattern CPd are defined as (-Xd, -Yd). Such pieces of coordinate information are loaded to the internal memory of the control apparatus MC before the exposure process.

In this example, each auxiliary pattern is square. However, an auxiliary pattern need not always have the square shape and may have another shape (for example, a rectangle, circle, polygon, pattern, number, symbol, character, or the like, may be used). As far as the auxiliary patterns can be observed in the visual field MF of the sensor S1, the distance between the alignment mark and each auxiliary pattern is not particularly limited, i.e., they may be close to or apart from each other.

The control apparatus MC loads information shown in Table 1 below to the internal memory (e.g., a RAM) as well as the coordinate information before the exposure process. The target alignment mark (P1 in this example) can be discriminated on the basis of the information.

TABLE 1

|    | CPa     | CPb     | CPc     | CPd    |
|----|---------|---------|---------|--------|
| L1 | present | present | absent  | absent |
| M1 | absent  | present | absent  | absent |
| N1 | absent  | present | present | absent |
| O1 | present | absent  | absent  | absent |
| P1 | absent  | absent  | absent  | absent |

To identify the target alignment mark P1, an alignment mark whose combination of auxiliary patterns matches the combination assigned to P1 in Table 1 is searched for from the five alignment marks. When the target alignment mark is discriminated on the basis of the presence/absence of auxiliary patterns at the four portions, as in this example, the target alignment mark can be discriminated from 16 alignment marks at a maximum.

The procedure of global alignment in the lithography system or exposure apparatus according to the preferred embodiment of the present invention will be described next with reference to FIGS. 6 and 7. The process shown in the flow charts in FIGS. 6 and 7 is controlled by the control apparatus MC.

Figure 6:
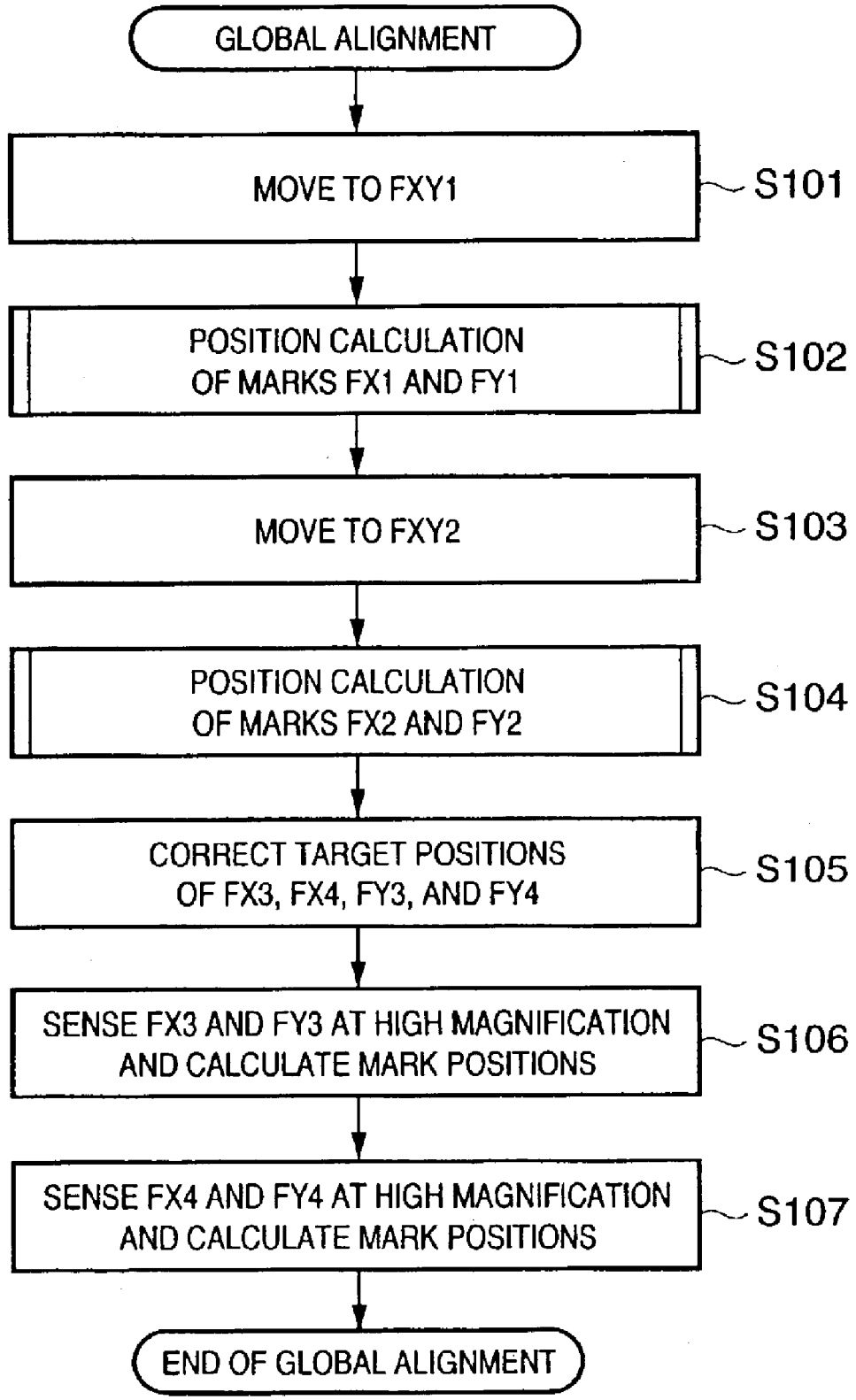
FIG. 6 is a flow chart for explaining the procedure of global alignment in the lithography system or exposure apparatus according to the preferred embodiment of the present invention.
Figure 7:
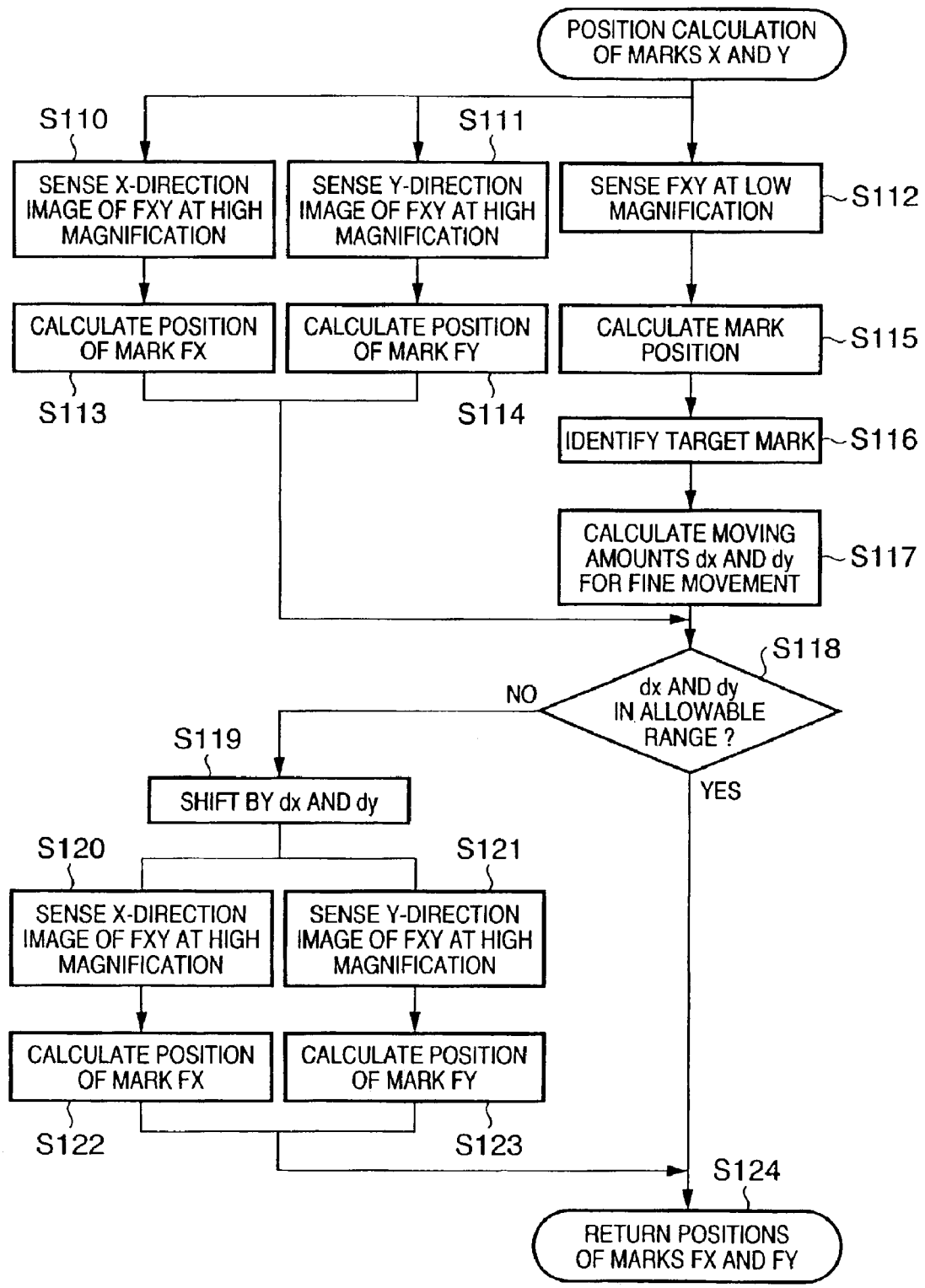
FIG. 7 is a flow chart for explaining the procedure of global alignment in the lithography system or exposure apparatus according to the preferred embodiment of the present invention.

The schematic procedure of global alignment is indicated by steps S101 to S107 in FIG. 6.

Figure 4:
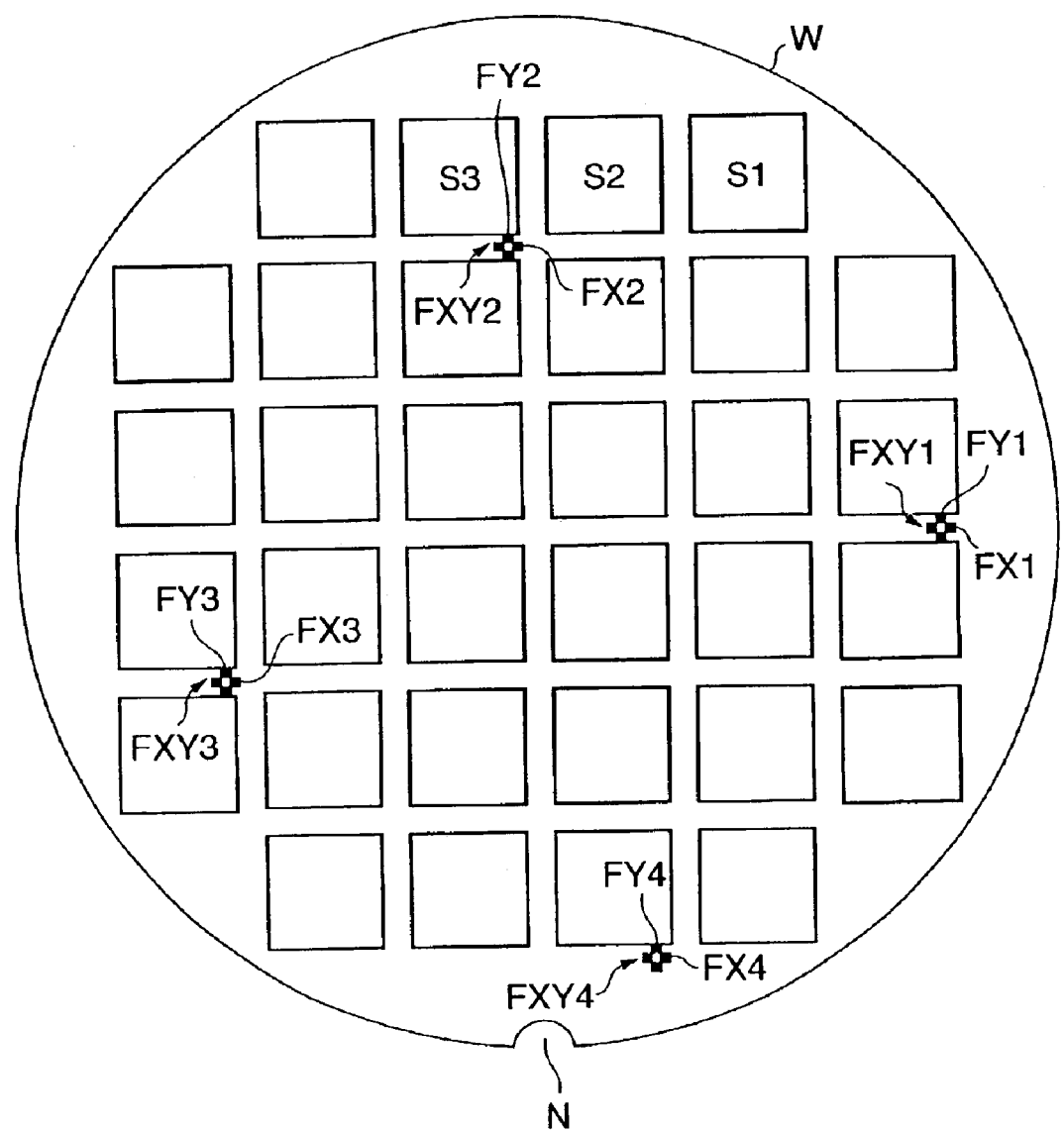
FIG. 4 is a view showing a shot region and global alignment marks on a wafer.

First, in step S101, the control apparatus MC outputs a command to a stage control apparatus STC to cause it to move the wafer stage STG such that the alignment mark FXY1 shown in FIG. 4 enters the visual field of the alignment scope SC. Typically, the stage control apparatus STC moves the stage STG to the target position in consideration of the position information of the stage STG, which is supplied from a stage position measuring apparatus (e.g., a laser interferometer) LP.

Each of the alignment marks FXY1 to FXY4 shown in FIG. 4 is designed to have the pattern shown in FIG. 8A. As shown in FIG. 2A (not illustrated in FIG. 4), one or a plurality of alignment marks (L1, M1, N1, and O1 in FIG. 2A) whose feature portions to be detected are common to those of the target alignment marks FXY1 to FXY4 (P1 in FIG. 2A) in the current global alignment are present around the target alignment marks.

In step S102, the control apparatus MC outputs commands to the processing apparatus P, alignment scope SC, and illumination light source Li to cause them to detect the positions of the marks FX1 and FY1 (i.e., the X- and Y-direction positions of the alignment mark) by observing the marks FX1 and FY1 (corresponding to the marks FX and FY in FIG. 8A) of the alignment mark FXY1. The detection result is sent from the processing apparatus P to the control apparatus MC.

The process procedure in step S102 (and step S104 to be described later) will now be described in detail with reference to the flow chart shown in FIG. 7. A description will be made here assuming that the high-magnification sensor S2 comprises an X-measurement high-magnification sensor for position measurement in the X direction and a Y-measurement high-magnification sensor for position measurement in the Y direction. In this case, each of the X-measurement high-magnification sensor and Y-measurement high-magnification sensor can include, e.g., a line sensor. The high-magnification sensor S2 may include an area sensor which simultaneously senses the mark FX 1 (FX) for the X-direction measurement and the mark FY1 (FY) for the Y-direction measurement.

In this embodiment, high-magnification image sensing of the mark FX1 (FX) for the X-direction measurement (step S110) and high-magnification image sensing of the mark FY1 (FY) for the Y-direction measurement (step S111) by the high-magnification sensor S2 and low-magnification image sensing by the low-magnification sensor S1 (S112) are simultaneously executed. These image sensing operations need not always be executed simultaneously. However, when these operations are executed simultaneously, the total process time can be shortened.

In addition, in this embodiment, position calculation of the mark FX (step S113) and position calculation of the mark FY (step S114) at the high magnification and position calculation of the target alignment mark FXY1 (FX in FIG. 8A) and the remaining alignment marks and auxiliary patterns at the low magnification (step S115) are executed in parallel. The position calculation of the marks FX and FY at the high magnification is executed by an arithmetic device COM2. The position calculation of the alignment mark FXY1 at the low magnification is executed by the arithmetic device COM1.

An image sensed at a high magnification may not include the image of the target alignment mark FXY1. In this case, an erroneous position (coordinates) is calculated as the position of the target alignment mark or the position calculation itself is impossible in steps S113 and S114. An example of the cause of such a position detection error is misalignment by the mechanical alignment apparatus MA. On the other hand, the visual field MF of the low-magnification system is designed to allow such an error. Hence, the target alignment mark can be sensed.

In step S115, the X- and Y-direction positions are calculated for all of the alignment marks L1, M1, N1, O1, and P1 (the target alignment mark is P1) and auxiliary patterns CPa, CPb, CPc, and CPd in the visual field MF of the low-magnification system (M1 and S1).

In step S116 next to step S115, the control apparatus MC identifies the target alignment mark P1 from the plurality of alignment marks on the basis of the calculation result in step S115 and the information shown in Table 1 (information loaded to the control apparatus MC in advance).

In step S117 next to step S116, the control apparatus MC calculates the moving amounts (shift amounts for fine measurement) dx and dy of the wafer W to move the target alignment mark P1 into the visual field HF of the high-magnification sensor S2, as shown in FIG. 8B.

In step S118, the control apparatus MC determines whether the moving amounts dx and dy calculated in step S117 fall within the allowable range. The allowable range means the range of positional shift amounts in which the position of the target alignment mark P1 can be detected using the high-magnification sensor S2 without moving the wafer W.

If it is determined that the moving amounts dx and dy fall within the allowable range, the control apparatus MC advances the process to step S124 to determine the position of the mark FX1 and the position of the mark FY1, which are calculated in steps S113 and S114, as the X- and Y-direction positions of the target alignment mark FXY1 (P1). Then, the flow advances to step S103 (returns to the main routine).

If it is determined that the moving amounts dx and dy fall outside the allowable range, the control apparatus MC outputs a command to the stage control apparatus STC in step S119 to cause it to finely move the wafer stage STG (i.e., the wafer W) to correct the shift amounts dx and dy. With this operation, of the plurality of alignment marks, the target alignment mark P1 enters the visual field of the high-magnification sensor S2.

Next, in steps S120 and S121, the control apparatus MC executes, preferably simultaneously, high-magnification image sensing of the mark FX1 (FX) for measurement in the X direction and high-magnification image sensing of the mark FY1 (FY) for measurement in the Y direction.

Next, in step S122 and S123, the control apparatus MC executes position calculation of the mark FX and position calculation of the mark FY in parallel. With this process, the X- and Y-direction positions of the target alignment mark FXY1 are accurately calculated (detected).

As described above, in this embodiment, the alignment scope SC that is designed to simultaneously sense alignment marks at high and low magnifications is arranged. With the alignment scope SC, image sensing operations at high and low magnifications are preferably simultaneously executed while keeping the wafer W stopped. The position of an alignment mark (it is unknown whether the alignment mark is the target alignment mark) is detected on the basis of the image sensing result at the high magnification. In addition, the target alignment mark is identified, and its position (and positional shift amount) is detected on the basis of the image sensing result at the low magnification.

It is determined on the basis of the position of the target alignment mark whether the alignment mark whose position is detected at the high magnification is the target alignment mark. If the alignment mark whose position is detected at the high magnification is the target alignment mark, the position detection result at the high magnification is used as the position detection result of the target alignment mark. Otherwise, the wafer W is moved to a position at which the identified target alignment mark can be observed at the high magnification, and the position of the target alignment mark is detected at the high magnification.

If the target alignment mark is within the visual field HF of the high-magnification sensor S2 from the beginning, and the position of the target alignment mark is detected from the beginning, the position of the target alignment mark can be detected by one position detection operation. Hence, according to this embodiment, the speed of global alignment can be increased.

Referring back to FIG. 6, after the position of the alignment mark FXY1 is calculated in step S102, the control apparatus MC outputs a command to the stage control apparatus STC to cause it to move the wafer stage STG such that the alignment mark FXY2 shown in FIG. 4 enters the visual field of the alignment scope SC. The control apparatus MC executes the same process as in step S102 (FIG. 7) for the alignment mark FXY2, thereby calculating the X- and Y-direction positions of the alignment mark FXY2.

When the positions of the two alignment marks FXY1 and FXY2 are detected, the position of the wafer W on the chuck CH can roughly be obtained. In this embodiment, target positions to be used to move the remaining alignment marks FXY3 (FX3 and FY3) and FXY4 (FX4 and FY4) into the visual field HF of the high-magnification sensor S2 are calculated on the basis of the position detection results of the alignments marks FXY1 and FXY2.

The target positions of the alignment marks FXY3 (FX3 and FY3) and FXY4 (FX4 and FY4) can be calculated in the following way. First, an X-direction shift amount (ShiftX), a Y-direction shift amount (ShiftY), rotation component θ, and a wafer magnification component Mag are obtained on the basis of the X- and Y-direction positions of the two alignments marks FXY1 and FXY2. The amounts ShiftX, ShiftY, and θ are shift amounts when the wafer W is placed on the chuck CH, and correspond to the offset of mechanical alignment. The amount Mag is the extension amount of the shot pattern on the wafer W.

If these amounts are large, even when the third and fourth alignment marks FXY3 and FXY4 are moved to the position immediately under the alignment scope SC on the basis of their designed positions, they cannot enter the visual field of the high-magnification system (M1, M2, and S2) of the alignment scope SC.

To prevent this, the shift between the shot layout of the wafer and the stage coordinate system is calculated on the basis of the amounts θ, Mag, ShiftX, and ShiftY. More specifically, a small correction amount to be used to align the grid on the wafer W to the grid of the wafer stage STG is obtained. When the target positions of the alignment marks FXY3 (FX3 and FY3) and FXY4 (FX4 and FY4) are corrected in accordance with the fine correction amount, the alignment marks FXY3 (FX3 and FY3) and FXY4 (FX4 and FY4) can be moved into the visual field HF of the high-magnification sensor S2 without using the low-magnification sensor S1.

When the θ component is corrected (for example, the wafer W is rotated by the chuck CH or stage STG), the third and fourth alignment marks FXY3 and FXY4 can be observed without any shift of the θ component. In this case, however, since a rotation operation is necessary, the total process time becomes long. From the viewpoint of process time, it is advantageous to omit correction of the θ component.

In step S106 next to step S105, the control apparatus MC moves the alignment mark FXY3 (FX3 and FY3) to the position immediately under the alignment scope SC in accordance with the corrected target position and detects the position of the alignment mark FXY3 using the high-magnification sensor S2. In step S107, the control apparatus MC moves the alignment mark FXY4 (FX4 and FY4) to the position immediately under the alignment scope SC in accordance with the corrected target position and detects the position of the alignment mark FXY4 using the high-magnification sensor S2. Thus, the global alignment is ended.

Figure 1:
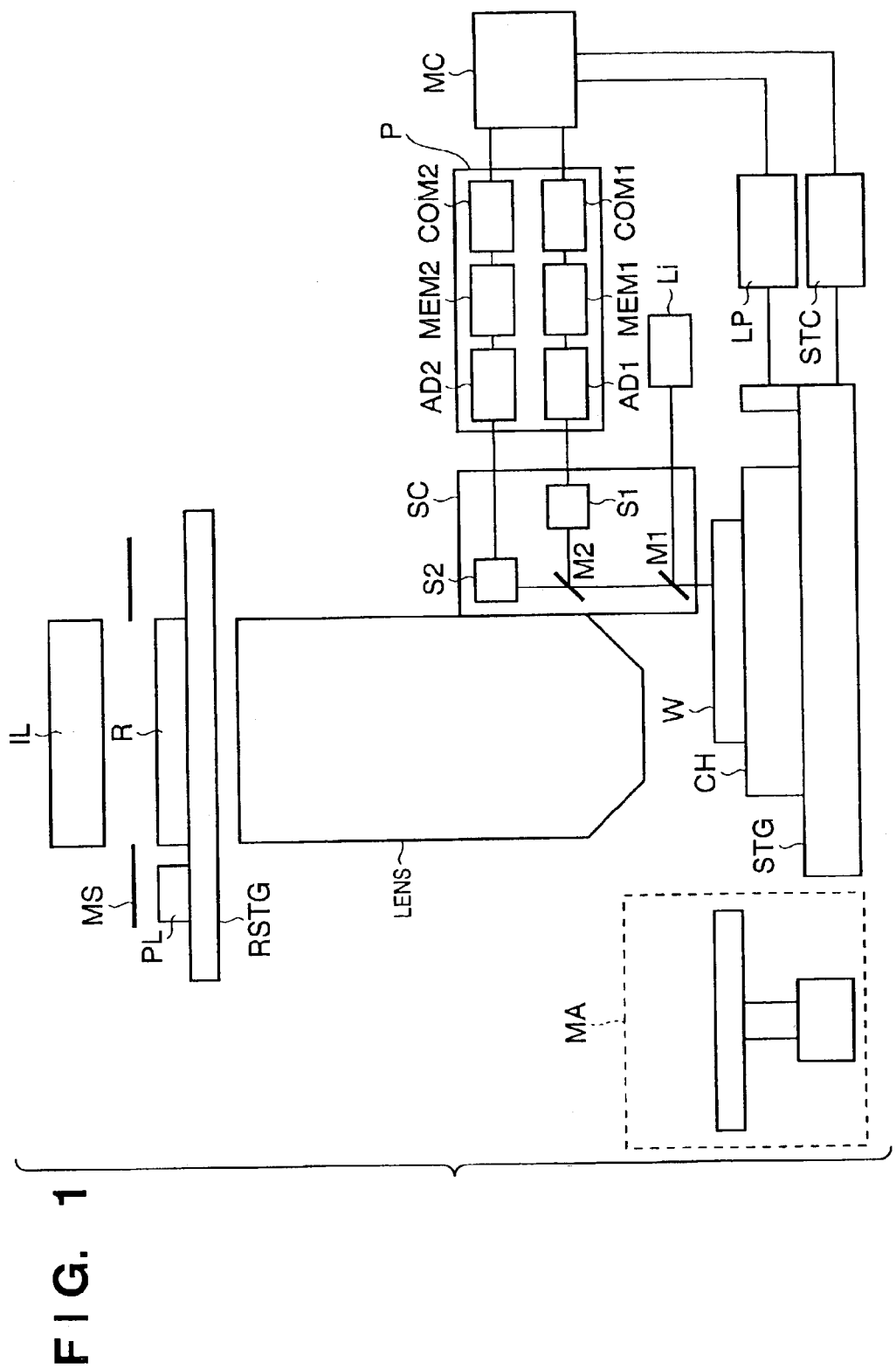
FIG. 1 is a view schematically showing the arrangement of a lithography system (exposure apparatus) according to a preferred embodiment of the present invention.

The arrangement example shown in FIG. 1 indicates a lithography system or exposure apparatus of an off-axis alignment scheme. However, when alignment marks can be simultaneously observed as low and high magnifications, any other alignment scheme can be employed. More specifically, the present invention can also be applied to, e.g., a TTL alignment scheme for observing an alignment mark through a projecting optical system LENS or a TTR alignment scheme for observing an alignment mark through a reticle R.

The number of alignment marks to be detected in global alignment and the number of alignment marks that can enter the visual field of the low-magnification system are not particularly limited.

In addition, the method of identifying a target alignment mark from a plurality of alignment marks in the visual field is preferably applied to the above lithography system or exposure apparatus capable of simultaneous observation with the low-magnification system and high-magnification system. However, the present invention can also be applied to a type of system which observes an alignment mark with the high-magnification system on the basis of an observation result from the low-magnification system. More specifically, the present invention can also be applied to a sequential process for observing alignment marks using the low-magnification system to identify and position-detect a target alignment mark (S112, S115, and S116), calculating the shift amounts dx and dy (S117), moving the stage STG by dx and dy (S119), and detecting the position of the target alignment mark P1 using the high-magnification system (S120, S121, and S122).

In this case, since the sequential process is executed, the time required for global alignment becomes long. However, even in a conventional hardware configuration incapable of simultaneous measurement at low and high magnifications, a target alignment mark can be identified from a plurality of alignment marks present in the visual field.

Figure 2C:
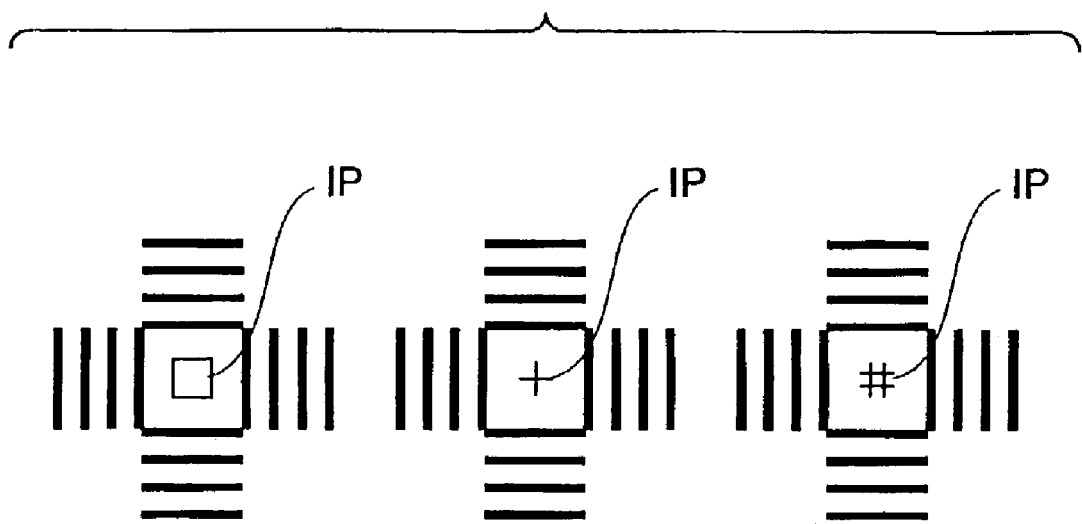
FIG. 2C is a view showing an example of auxiliary patterns.
Figure 2D:
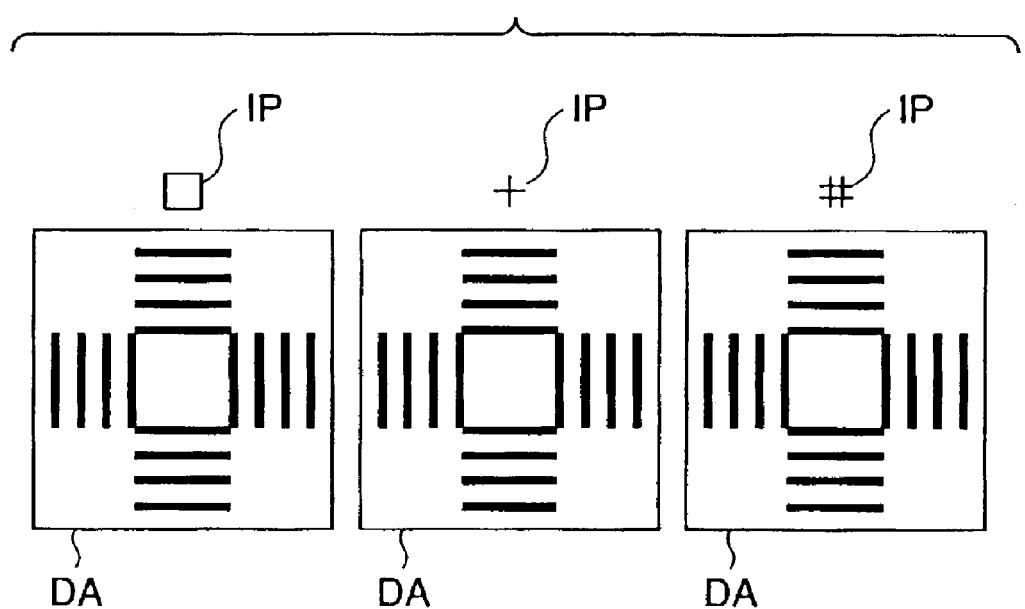
FIG. 2D is a view showing another example of auxiliary patterns.

Auxiliary patterns to be used to identify alignment marks are not limited to the example shown in FIG. 2B. Any shape and layout can be employed as long as alignment marks can be identified. For example, as shown in FIG. 2C, auxiliary patterns (identification marks) different between alignment marks may be used. As shown in FIG. 2D, auxiliary patterns (identification marks) IP may be laid out outside regions DA defined for formation of alignment marks. In this case, when the positions of a plurality of alignment marks that are present in the low-magnification visual field are calculated, and then, the shape of the auxiliary pattern IP having a predetermined positional relationship from the position (e.g., the central position) of each alignment mark is detected by image processing such as template matching using a template for each auxiliary pattern, the target alignment mark can be identified.

Figure 2E:
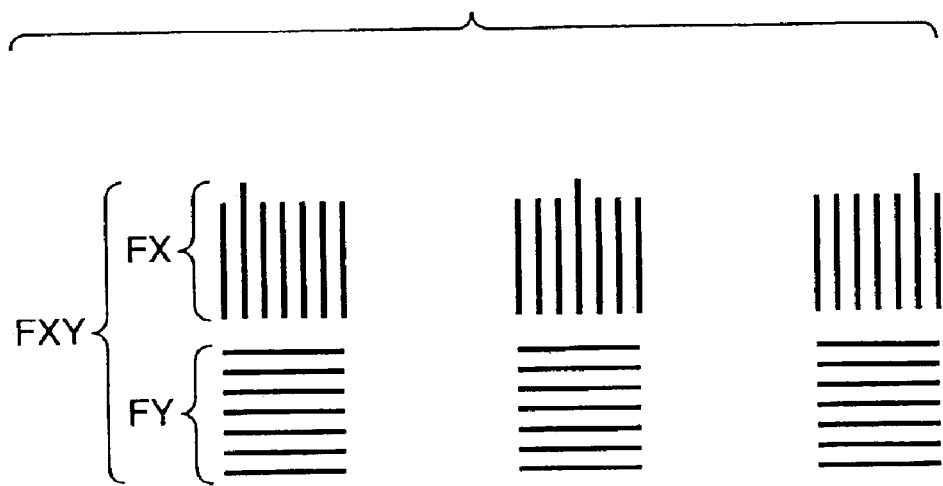
FIG. 2E is a view showing still another example of auxiliary patterns.

Furthermore, as shown in FIG. 2E, in the alignment mark FXY formed from the X-direction measurement mark FX and Y-direction measurement mark FY, each alignment mark is made to partially have a form different from those of the remaining alignment marks and deformed without generating any influence, thereby identifying the alignment marks. In this case, the deformed portions (the projecting portions in the example shown in FIG. 2E) correspond to auxiliary patterns. As an identification method, various methods can be applied, including a method of measuring the size such as the length of a corresponding portion.

[Second Embodiment]

Another embodiment which identifies a target alignment mark from a plurality of alignment marks in a single visual field will be described. The basic hardware configuration, alignment marks, and measurement flow are the same as those of the first embodiment, and a description thereof will be omitted. Only different points will be described.

Figure 3A:
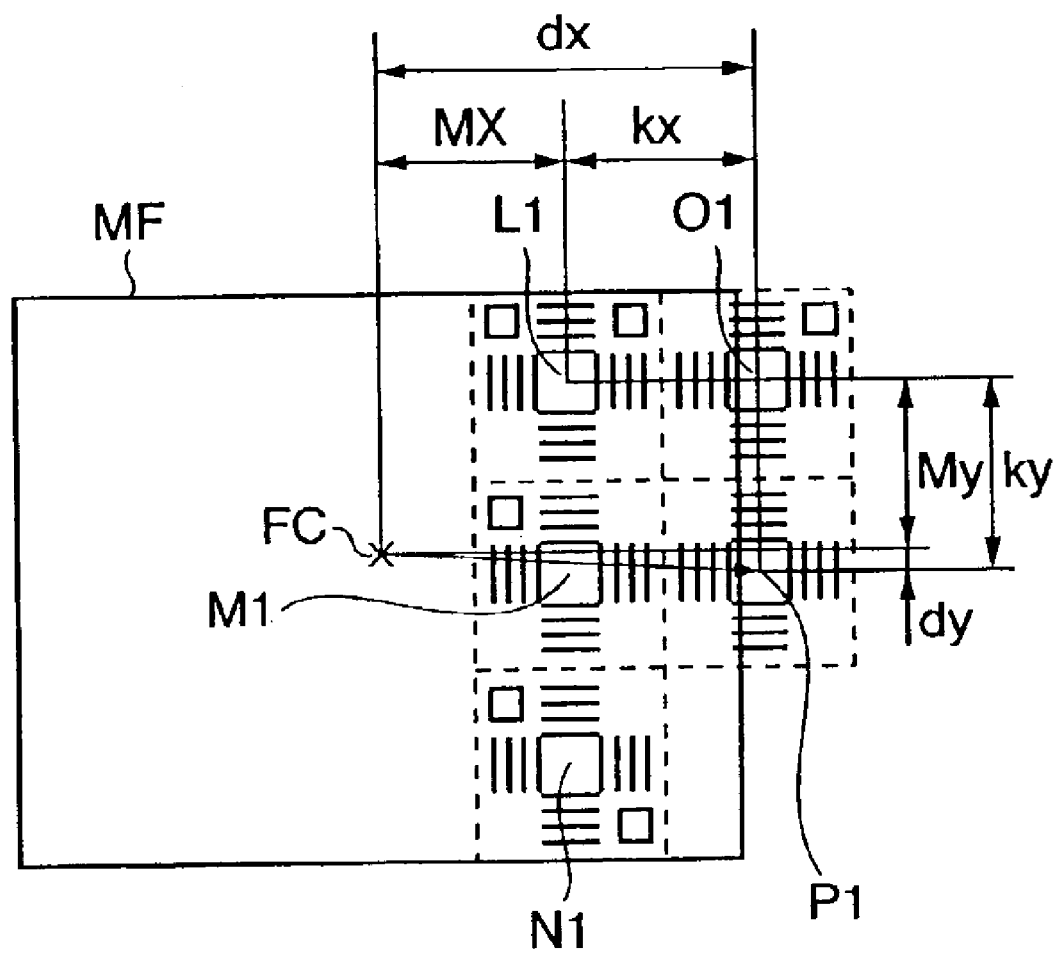
FIG. 3A is a view showing an example of a group of alignment marks partially observed in a low-magnification visual field.
Figure 3B:
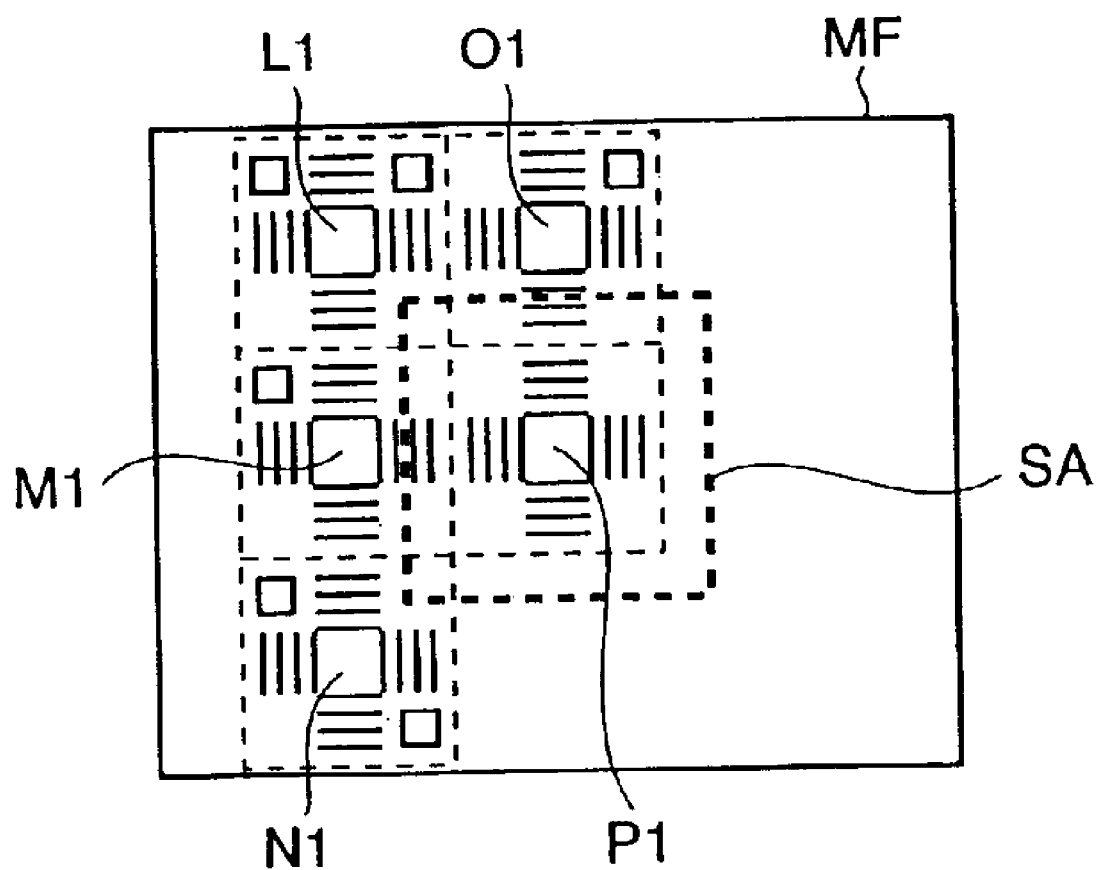
FIG. 3B is a view for explaining a change of a search range.

As shown in FIG. 3A, when a target alignment mark P1 is located outside a visual field MF of a low-magnification sensor S1, position detection of the target alignment mark P1 is normally impossible. However, since alignment marks L1, M1, and N1 other than the target alignment mark P1 are present in the visual field MF, fine shift amounts dx and dy or the position of the alignment mark P1 can be calculated in step S117 when the positional relationship between the alignment mark P1 and each of the alignment marks L1, M1, and N1 is known.

For example, assume that the alignment mark L1 can be identified in accordance with its auxiliary pattern, and the position of the alignment mark L1 can be detected. In this case, the X- and Y-direction relative distances between the alignment mark L1 and the target alignment mark P1 are kx and ky. When the alignment mark L1 detected within the visual field MF is shifted from a visual field center FC by shift amounts MX and MY, the amounts dx and dy of the movement of a stage STG for fine measurement using the high-magnification system are calculated by dx=MX+kx and dy=MY+ky, respectively.

As described above, even when the target alignment mark is not present in the visual field, or the target alignment mark cannot be identified, as long as the alignment marks around the target alignment mark can be identified, and their positions can be detected, the position of the target mark can be calculated on the basis of the known positional relationship between each alignment mark and the target mark. Hence, the target mark can be moved to a visual field HF of the high-magnification system, and the position of the target mark can be detected at a high magnification.

[Third Embodiment]

Still another embodiment which identifies a target alignment mark from a plurality of alignment marks in a single visual field will be described. The basic hardware configuration, alignment marks, and measurement flow are the same as those of the first embodiment, and a description thereof will be omitted. Only different points will be described.

Wafers are normally processed in blocks of lots. The lots are processed by a single manufacturing apparatus. When the reproducibility of mechanical alignment is high, amounts ShiftX, ShiftY, and θ calculated for the first wafer are defined as the offset of mechanical alignment. The position of the second wafer is shifted in advance by the amounts ShiftX, ShiftY, and θ. When this wafer is placed on a stage STG, the offset error of mechanical alignment becomes close to 0.

Hence, even when a plurality of alignment marks are observed in a single visual field, the target alignment mark is sensed at the center of the visual field. In this case, preferably, a search range SA in which an alignment mark is to be searched for in a visual field MF is limited near the center of the visual field MF so as not to search for any alignment mark outside the search range SA. The search range SA is set to be larger than a high-magnification visual field HF and always allows observation of the target alignment mark within the allowable mechanical alignment error. With this arrangement, the time required for image processing for searching for a target mark is shortened.

If the mechanical alignment accuracy and reproducibility are high, and the amounts ShiftX and ShiftY fall within the allowable range for detection at a high magnification, target alignment mark position detection using the low-magnification system and wafer movement on the basis of the detected position of the target alignment mark can be omitted, as a matter of course.

[Fourth Embodiment]

Still another embodiment which identifies a target alignment mark from alignment marks in a single visual field will be described. In the first to third embodiments, an auxiliary pattern is added to a target alignment mark, and the target alignment mark is discriminated using the auxiliary pattern. The fourth embodiment provides a method of discriminating a target alignment mark from a plurality of alignment marks present in a visual field without using any auxiliary pattern. The basic hardware configuration, alignment marks, and measurement flow are the same as those of the first embodiment, and a description thereof will be omitted. Only different points will be described.

Figure 3C:
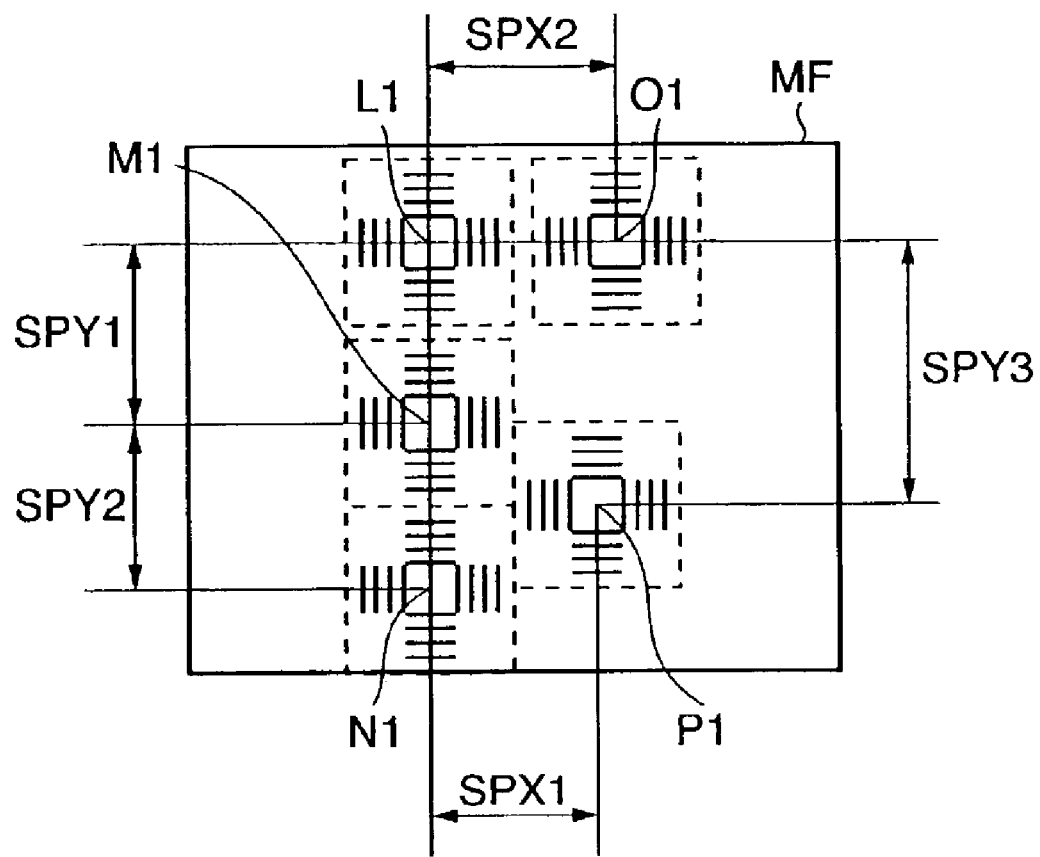
FIG. 3C is a view showing an example of a layout of alignment marks.

In the example shown in FIG. 3C, a target alignment mark P1 and a plurality of alignment marks L1, M1, N1, and O1 are present in a low-magnification visual field MF. In the example shown in FIG. 3C, the positions of the alignment marks are determined such that the alignment marks are separated from each other by different distances in the visual field MF. More specifically, in the example shown in FIG. 3C, lengths SPX1, SPX2, SPY1, and SPY2 are set to be different from each other.

For example, when the positions of two or more alignment marks can be detected in the visual field MF, the alignment marks can be identified in step S116 on the basis of the relative positional relationship between the alignment marks. Then, the position (and necessary moving amounts dx and dy) of the target alignment mark can be detected in step S117 on the basis of the known positional relationship between the target alignment mark and the identified alignment marks.

As described above, when the position of the target alignment mark (e.g., P1) is detected, the moving amounts dx and dy necessary for observing the target alignment mark at a high magnification can be calculated. By moving a stage STG in accordance with the moving amounts, the target alignment mark can be observed at a high magnification, and its position can be detected.

[Fifth Embodiment]

Still another embodiment which identifies a target mark from a plurality of alignment marks in a single visual field will be described. In the fifth embodiment, a method of identifying a target alignment mark from a plurality of alignment marks that are present in a visual field without using any auxiliary pattern and setting different distances between the plurality of alignment marks. The basic hardware configuration, alignment marks, and measurement flow are the same as those of the first embodiment, and a description thereof will be omitted. Only different points will be described.

Figure 3D:
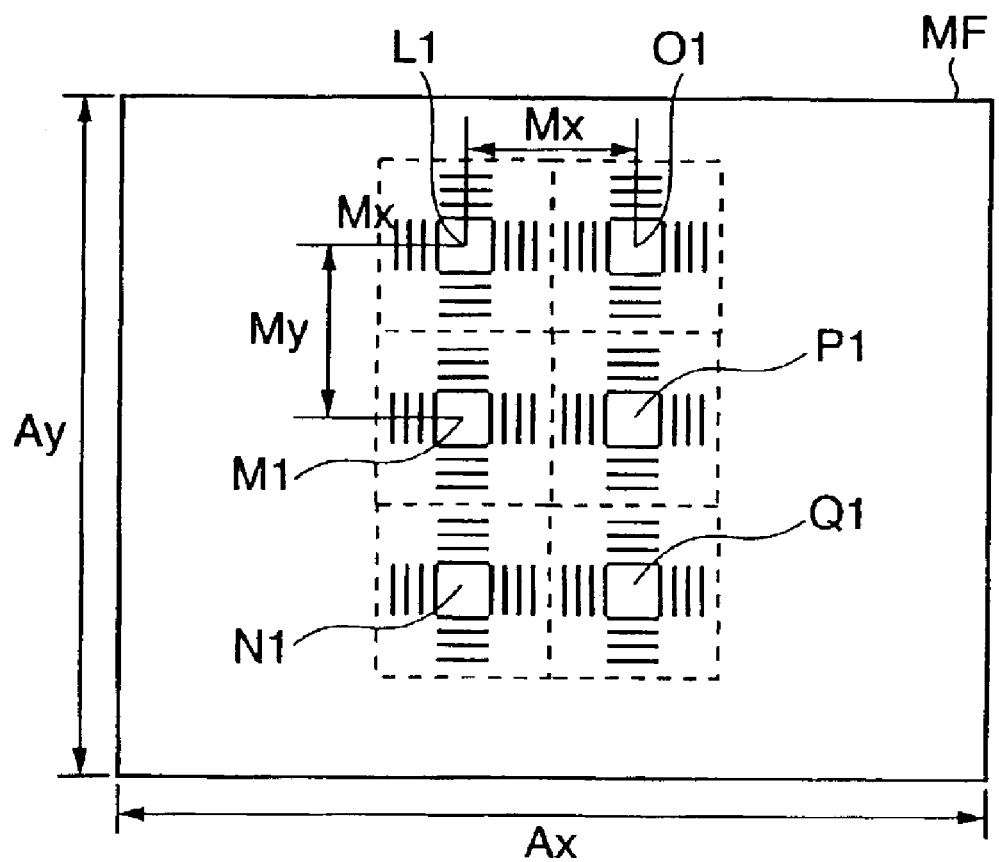
FIG. 3D is a view showing another example of a layout of alignment marks.

In this embodiment, when all or some of the alignment marks L1, M1, N1, O1, P1, and Q1 are present in a visual field MF, as shown in FIG. 3D, the position of a target alignment mark is detected on the basis of the positions and number of alignment marks detected in the visual field MF. A description will be given below assuming that the target alignment mark in the alignment marks L1, M1, N1, O1, P1, and Q1 is P1.

First, a case wherein all the alignment marks L1, M1, N1, O1, P1, and Q1, including the target alignment mark P1, are present in the visual field MF, as shown in FIG. 3D, will be examined. In this case, the position of the target alignment mark P1 can be identified, and its position can be detected on the basis of the known position (the second column of the second row in this example) of the target alignment mark P1 in the group of alignment marks L1, M1, N1, O1, P1, and Q1.

Figure 3E:
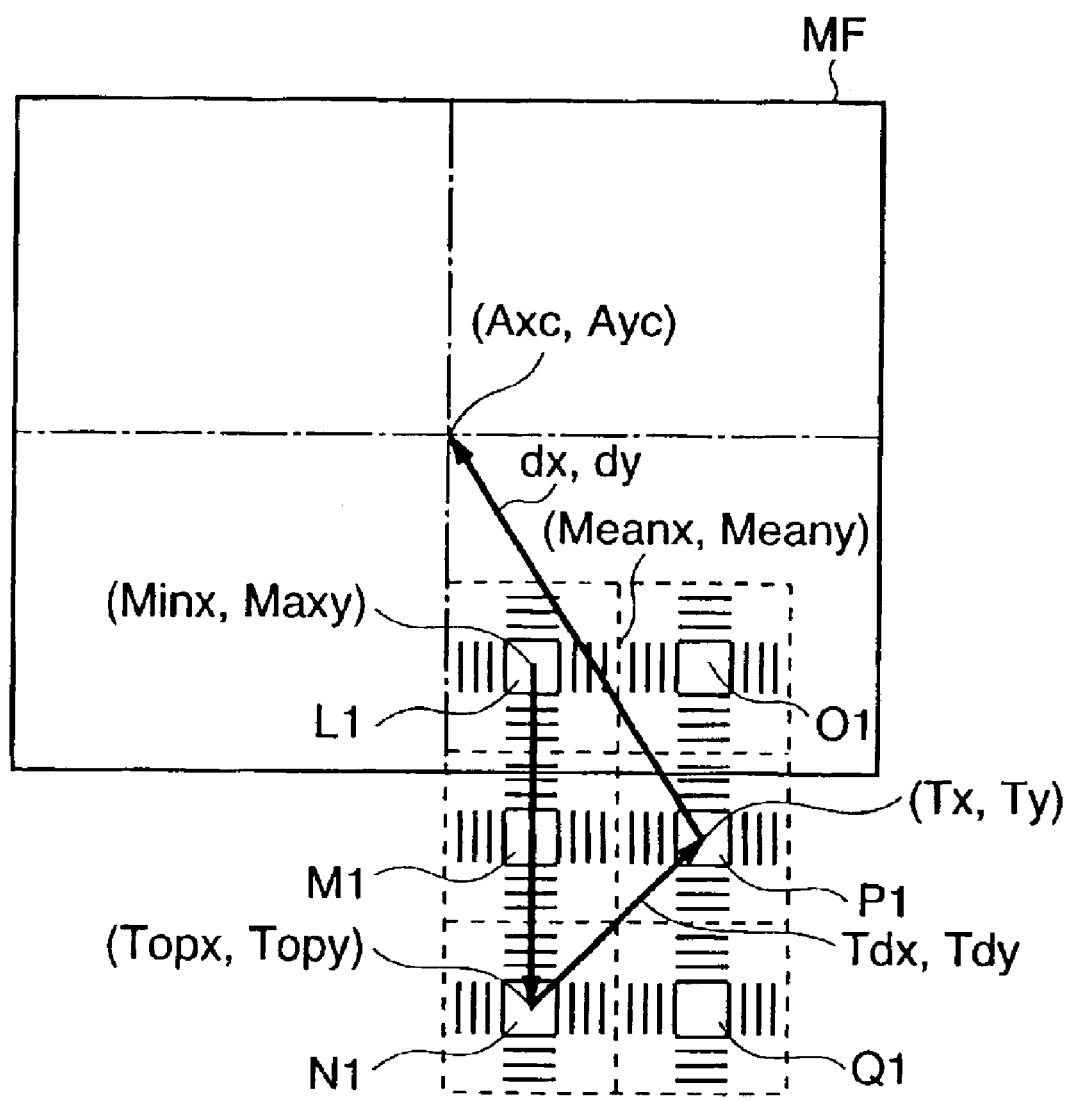
FIG. 3E is a view showing an example of a group of alignment marks partially observed in a low-magnification visual field.

A method of estimating (determining) a target mark will be described with reference to FIG. 3E, including a case wherein only some of the alignment marks are detected in the visual field MF. A description will be made assuming that the lower left apex of the visual field MF is defined as the origin (0,0) of the coordinate system. In this case, the visual field MF corresponds to the upper right quadrant of the coordinate system.

Let Ax be the X-direction size of the visual field MF, Ay be the Y-direction size, Mx be the X-direction interval between the alignment marks, and My be the Y-direction interval. Nx (number of columns) X Ny (number of rows) alignment marks are two-dimensionally laid out. The following conditions are satisfied.

$$Ax > Mx^{*}(Nx-1)$$

$$Ay > My^{*}(Ny-1)$$

The start alignment mark in the alignment mark group two-dimensionally laid out is defined as the alignment mark at the lower left of the alignment mark group. The coordinates of the plurality of alignment marks detected in the visual field MF are defined as (Xij,Yij) {i=1, 2, . . . , k, j=1, 2, . . . , 1, k≦Nx, 1 ≦Ny}.

On the basis of the above definition, the method of determining the position (coordinates) of the target mark and the moving amounts (shift amounts) to the target mark will be described. As an example, a method of identifying the target mark P1 on the basis of the number of detected alignment marks in the Y direction (the number of alignment marks whose positions can be detected in the visual field) will be described.

When the number of alignment marks that can be detected in the visual field MF is l (<Ny), the upper or lower portion of the Ny alignment marks arrayed in the Y direction falls outside the visual field MF. When l =Ny, no alignment marks fall outside the visual field MF in the Y direction.

First, the moving direction (upward or downward) of the alignment mark group in the visual field MF is determined. This determination can be done in accordance with, e.g., the following procedure. First, an average position in the Y direction is obtained for each detected alignment mark.

$$Meany = \frac{1}{k}\sum_{j=1}^{k} y_{1y}$$

Then, Meany is compared with the center of the visual field MF Ayc=Ay/2. If Meany>Ayc, it is determined that the alignment mark group has moved upward in the visual field MF. If Meany<Ayc, it is determined that the alignment mark group has moved downward in the visual field MF.

Next, the start coordinates of the alignment mark group are calculated. The start coordinates are defined as the coordinates of the alignment mark at the lowermost position in the Y direction and leftmost position in the X direction. When it is determined from the above comparison result that the alignment mark group has moved upward in the visual field MF, a position Topy of the start alignment mark corresponds to an alignment mark position Miny=Min($y_{1j}$ {j=1, 2, . . . , 1}) which has the minimum y-coordinate value in the detected alignment mark positions.

On the other hand, if it is determined that the alignment mark group has moved downward in the visual field MF, the start alignment mark may fall outside the visual field MF. An alignment mark Maxy=Max($y_{1j}$ {j=1, 2, . . . , 1}) which has the maximum y-coordinate value in the detected alignment mark positions corresponds to the position of the alignment mark at the upper left corner of the alignment mark group. Hence, a coordinate calculated by Maxy−My*(Ny−1) indicates the position of the start alignment mark. For the Y direction as well, the position of the start alignment mark is determined by the same calculation as described above. With this operation, the coordinates of the start alignment mark at the lower left corner of the alignment mark group can be determined.

That is, the coordinates of the start alignment mark can be determined in accordance with the following conditions.

If (Meanx≧Axc)

$$Topx=Min(x_{i1} \{i=1, 2, \ldots, k\})$$

If (Meanx<Axc)

$$Topx=Max(x_{i1} \{i=1, 2, \ldots, k\})-Mx^{*}(Nx-1)$$

If (Meany≧Ayc)

$$Topy=Min(y_{1j} \{j=1, 2, \ldots, l\})$$

If (Meany<Ayc)

$$Topy=Max(y_{1j} \{j=1, 2, \ldots, l\})-My^{*}(Ny-1)$$

Next, the target mark coordinates are estimated on the basis of the start alignment mark coordinates (Topx,Topy). The relative distances (Tdx and Tdy) between the target alignment mark and the start alignment mark are known. Hence, the positions of the target alignment mark coordinates (Tx,Ty) are calculated by $$Tx=Topx+Tdx$$

$$Ty=Topy+Tdy$$

Finally, the distance from the center of the visual field MF to the target alignment mark is obtained, and the moving amounts (dx and dy) of the stage STG necessary for observing the center of the target alignment mark at the center of a visual field HF of the high-magnification system are calculated in accordance with $$dx=Ax/2-Tx$$

$$dy=Ay/2-Ty$$

Even in an extreme case wherein only one alignment mark is detected in the visual field MF, the moving direction of the alignment mark group can be determined, and the coordinates of the target alignment mark that is not present in the visual field MF and the necessary stage moving amounts can be determined. As a matter of course, even when the positions of all alignment marks are detected, the coordinates of the target alignment mark and the necessary stage moving amounts can be determined in accordance with the above procedure.

The example shown in FIG. 3E will be described in detail. In the example shown in FIG. 3E, Nx=2 and Ny=3. The group of six alignment marks has moved to the lower right side in the visual field MF. The positions of the alignment marks L1 and O1 can be detected. The target alignment mark is P1. When the average values Meanx and Meany of the coordinates of the detected alignment marks are compared with the visual field center (Axc,Ayc), Meanx>Axc and Meany<Ayc.

Since Meanx>Axc, the minimum value Minx of the x-coordinate of the detected alignment mark is selected, and Topx=Minx.

In addition, since Meany<Ayc, the maximum value of the y-coordinate of the detected alignment mark is selected, and Topy=Maxy−My*(3−1).

Since the distances Tdx and Tdy between the target alignment mark P1 and the start alignment mark in the group of the six alignment marks are known, the coordinates (Tx,Ty) of the target alignment mark P1 can be calculated in accordance with $$Tx=Topx+Tdx$$

$$Ty=Topy+Tdy$$

Then, the moving distances necessary for moving the target alignment mark P1 to the visual field center of the visual field MF (and visual field HF) can be calculated by $$dx=Ax/2-Tx$$

$$dy=Ay/2-Ty$$

In this way, even in a case wherein the target mark cannot be specified in the visual field, when the total number of alignment marks and the relative position of the target alignment mark in the alignment mark group are known on the basis of the positions and number of detected alignment marks, the position of the target mark can be detected, and the moving amounts dx and dy necessary for moving the stage STG for detection at the high magnification can be calculated. When the stage STG is moved in accordance with the moving amounts, the target alignment mark can be moved into the visual field HF of the high-magnification system, and the position of the target alignment mark can be detected at the high magnification.

As described above, according to this embodiment, on the basis of the number and positions of alignment marks detected in the visual field MF (in consideration of the known relative position of the target alignment mark in the group of alignment marks), in step S117, the position of the target alignment mark can be detected, the moving amounts dx and dy necessary for observation of the target alignment mark at a high magnification can be calculated, and by moving the stage STG in accordance with the moving amounts, the target alignment mark can be observed at the high magnification, and its position can be detected.

[Sixth Embodiment]

An auxiliary pattern used to identify an alignment mark can be formed by transferring a pattern formed on a reticle R onto a wafer. This embodiment provides a method of transferring an auxiliary pattern by means other than a reticle.

As shown in FIG. 2A, drawing alignment marks and auxiliary patterns on the reticle R and exposing the alignment marks and auxiliary patterns to a wafer in each step of semiconductor manufacturing restrict the reticle design. Hence, it is preferable to transfer auxiliary patterns onto a wafer using the function of an exposure apparatus. In this case, the marks or patterns to be drawn on the reticle R are only alignment marks (and device patterns).

Figure 5A:
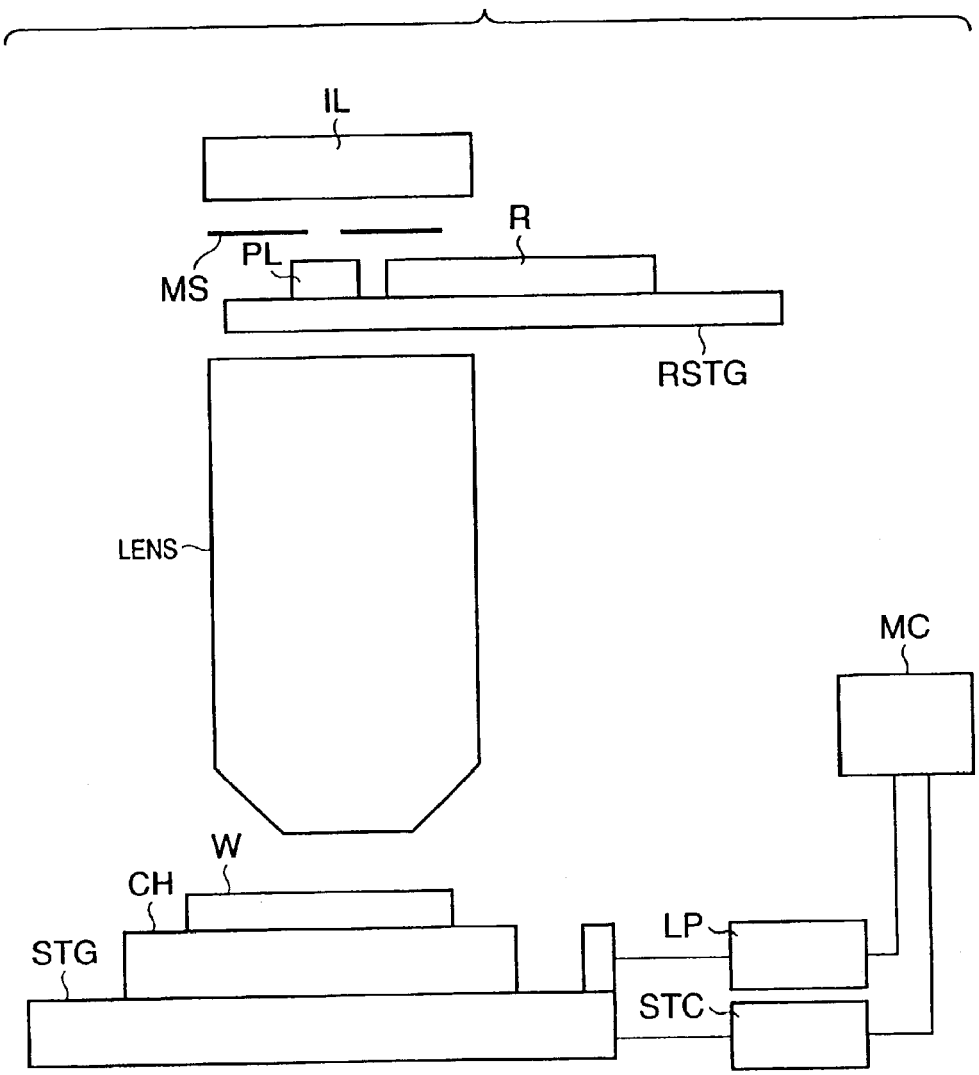
FIG. 5A is a view schematically showing the arrangement of a lithography system (exposure apparatus) according to another preferred embodiment of the present invention, which has an auxiliary pattern transfer function.

FIG. 5A is a view showing the schematic arrangement of an exposure apparatus according to the sixth embodiment of the present invention. The same reference numerals as in FIG. 1 denote the same constituent elements. An alignment scope SC, processing apparatus P, illumination light source Li, and mechanical alignment apparatus MA are not illustrated in FIG. 5A for the illustrative convenience.

When global alignment is ended, the exposure apparatus executes step-and-scan exposure or step-and-repeat exposure to transfer the pattern on the reticle R onto a wafer W. At this time, several alignment marks FXY are also simultaneously transferred. After that, the exposure apparatus executes a step of adding auxiliary patterns into the definition regions of the alignment marks or around them.

Patterns LM, MM, NM, and OM for auxiliary pattern formation are formed in advance, as shown in FIG. 5B, on a reference plate PL placed on the surface of the reticle R shown in FIG. 5A. When a masking blade MS is driven, exposure light from an illumination system IL irradiates only a specific region of the reference plate PL. A reticle stage RSTG on which the reticle R and reference plate PL are placed is driven by a linear motor (not shown) such that a corresponding pattern on the reference plate PL moves into the exposure region while the position of the reticle stage is accurately measured by a position detection apparatus (e.g., an interferometer). A wafer stage STG on which the wafer W is placed moves the wafer W such that the position on the wafer W where an alignment mark is to be formed matches the exposure region by the exposure light passing through the blade MS.

An example in which an alignment mark O1 shown in FIG. 2A and its auxiliary pattern are to be formed will be described. First, in projecting and exposing a device pattern, a pattern (this pattern is formed together with the device pattern) corresponding to the alignment mark O1 is transferred onto the wafer W together with the device pattern.

Figure 5C:
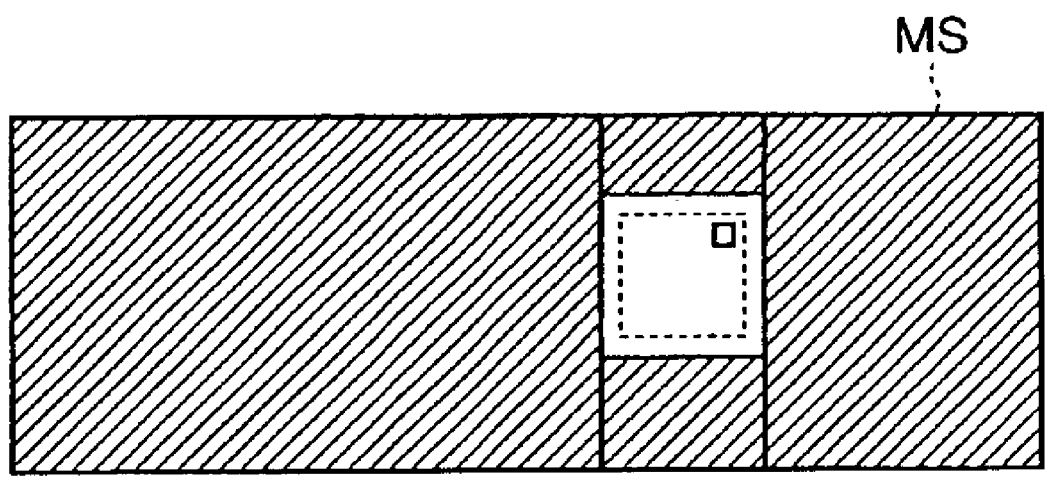
FIG. 5C is a view for explaining the auxiliary pattern transfer function.

Next, the pattern OM on the reference plate PL, which is used to form an auxiliary pattern for identification of the alignment mark O1, is transferred to a predetermined position (in the definition region of the alignment mark O1 in this example) of the wafer W. At this time, the position of the blade MS is controlled such that only the region OM of the reference plate PL is irradiated, as shown in FIG. 5C.

For auxiliary patterns for alignment marks L1, M1, N1, and P1 as well, the mask patterns LM, MM, and NM are transferred every time the corresponding device patterns and the alignment marks L1, M1, N1, and P1 are transferred.

Alternatively, instead of preparing mask patterns for a plurality of kinds of auxiliary patterns on the reference plate PL, only one mask pattern for an auxiliary pattern may be prepared and transferred to positions CPa, CPb, CPc, and CPd shown in FIG. 2B using the center of the alignment marks as a reference. To do this, for example, the blade MS is located such that only the region of the mask pattern OM shown in FIG. 5B is illuminated, and the position of the wafer stage STG is controlled such that the mask pattern OM is transferred to the positions CPa, CPb, CPc, and CPd.

The shape of the mask pattern for an auxiliary pattern is not limited to that shown in FIG. 5B. For example, the mask pattern may be designed to transfer an auxiliary pattern having a rectangular shape, cross shape, or number sign shape as shown in FIGS. 2C and 2D by example. Alternatively, for the mask pattern for an auxiliary pattern, part of an alignment mark may be extended, and the extended portion may be used as an auxiliary pattern as shown in FIG. 2E by example.

The auxiliary pattern transfer operation can be controlled by setting a job of the lithography system. Which type of auxiliary pattern should be transferred before, after, or at the time of exposure of an alignment mark is set in the job. On the basis of this setting, the driving positions of the blade MS and wafer stage STG can be controlled by a control apparatus MC.

[Device Manufacturing Method]

A device manufacturing method will be described below as an application example of the exposure apparatus according to the present invention described in accordance with the above embodiments by example.

Figure 9:
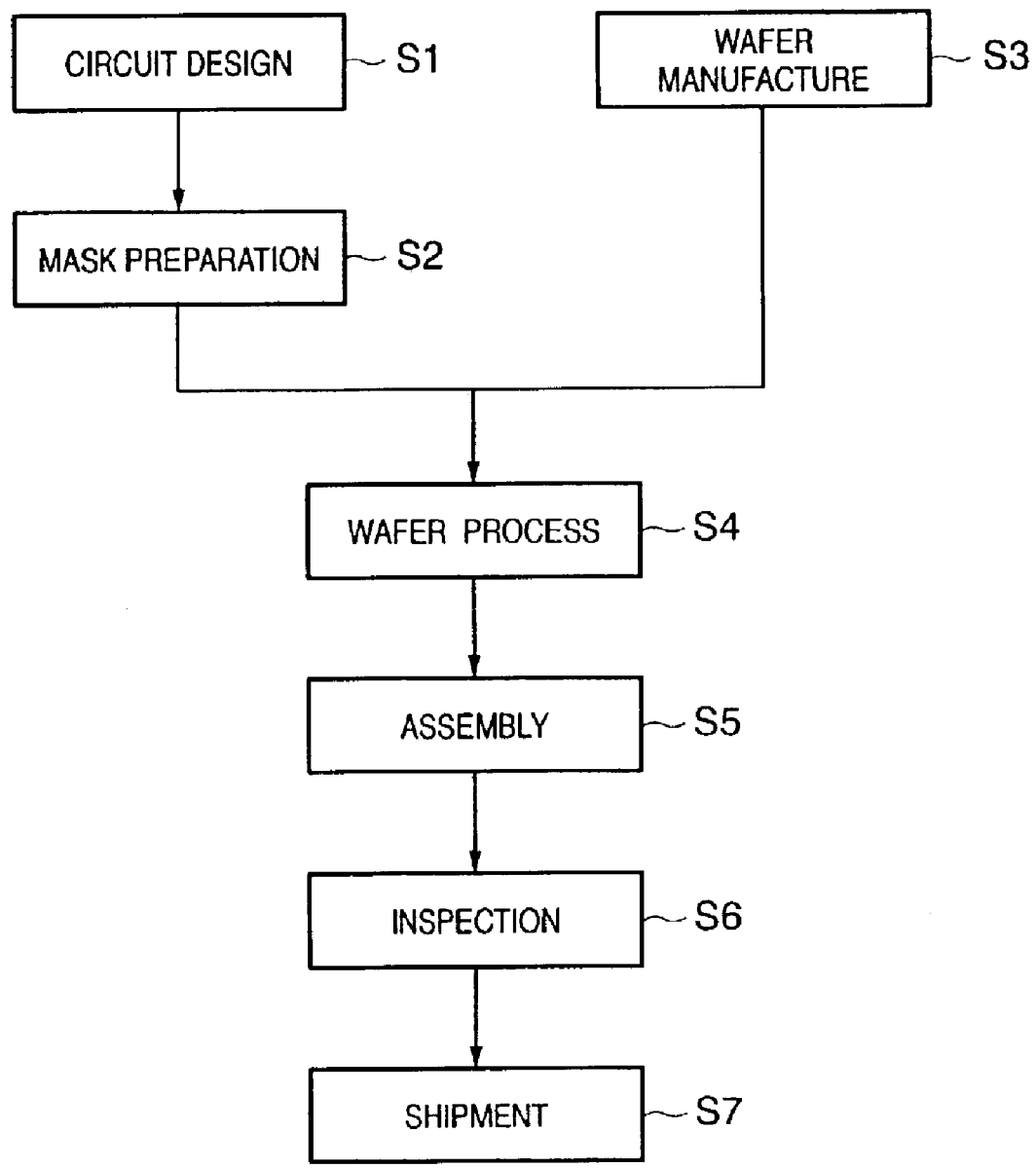
FIG. 9 is a flow chart showing the flow of the entire manufacturing process of a semiconductor device.

FIG. 9 is a flow chart showing the entire flow of the semiconductor device manufacturing process. In step 1 (circuit design), the circuit of a semiconductor device is designed. In step 2 (mask preparation), a mask is prepared on the basis of the designed circuit pattern. On the other hand, in step 3 (wafer manufacture), a wafer is manufactured using a material such as silicon.

In step 4 (wafer process), called a preprocess, an actual circuit is formed on the wafer by lithography using the above mask and wafer. In step 5 (assembly), called a post-process, a semiconductor chip is formed from the wafer prepared in step 4. This step includes processes such as assembly (dicing and bonding) and packaging (chip encapsulation).

In step 6 (inspection), inspections including an operation check test and a durability test of the semiconductor device manufactured in step 5 are performed. A semiconductor device is completed with these processes and shipped (step 7).

Figure 10:
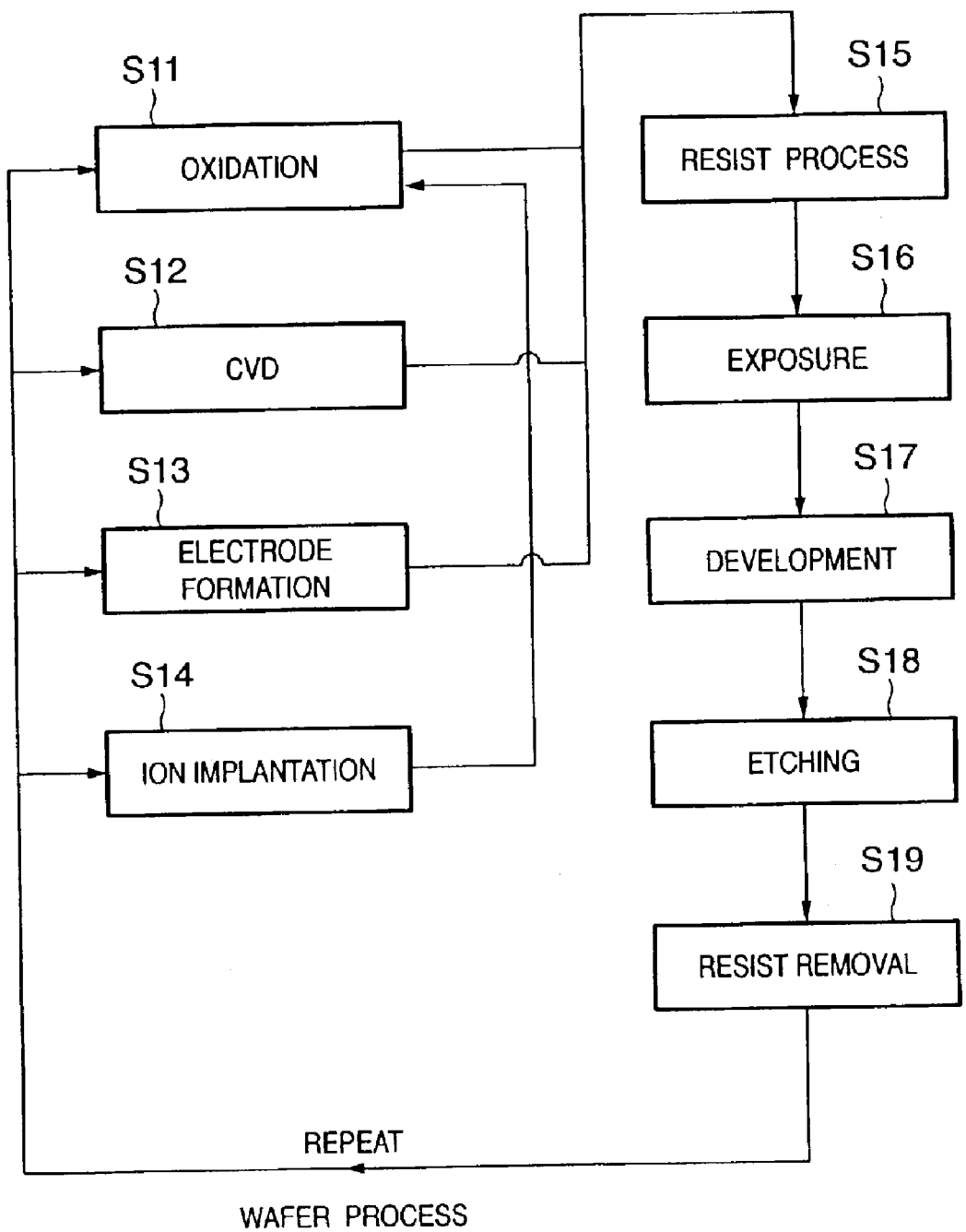
FIG. 10 is a flow chart showing the flow of the entire manufacturing process of a semiconductor device.

FIG. 10 shows the detailed flow of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive material is applied to the wafer.

In step 16 (exposure), the circuit pattern (device pattern) is transferred onto the wafer by the above exposure apparatus. At this time, an alignment mark (position detection mark) and auxiliary pattern are transferred to a position between chip regions or to a scribing line together with the circuit pattern. The auxiliary pattern may be transferred to the wafer using an auxiliary pattern mask prepared in the exposure apparatus.

In step 17 (development), the exposed wafer is developed. In step 18 (etching), portions other than the developed resist image are etched. In step 19 (resist removal), any unnecessary resist remaining after etching is removed. By repeating these steps, a multilayered structure of circuit patterns is formed on the wafer.

As described above, according to the preferred embodiments of the present invention, a target alignment mark can be identified from a plurality of alignment marks (position detection marks) and/or the position of the target alignment mark can be detected. The target alignment mark can be identified using, e.g., an auxiliary mark. The auxiliary mark is preferably formed in a region where a mark or pattern for position detection can be formed, e.g., a region between chip regions. The auxiliary mark may be transferred to a wafer together with a device pattern and an alignment mark by, e.g., projecting a master onto the wafer. Alternatively, the auxiliary mark may be transferred to the wafer using a mask for the auxiliary pattern prepared in the exposure apparatus. According to the latter method, no auxiliary pattern need be formed when the master such as a mask or reticle is formed. Hence, the restriction at the time of master formation is reduced.

The target alignment mark can also be identified by separating the plurality of alignment marks by different distances and detecting the distances between the alignment marks at the time of observation. Even in a case wherein the target mark is located outside the visual field of an observation apparatus such as an alignment scope, when any one of the plurality of alignment marks can be identified on the basis of the distance between the alignment marks, and the position of the identified alignment mark can be detected, the position of the target alignment mark whose position relative to the detected alignment mark position is known can be detected.

The target alignment mark can also be identified on the basis of the layout of the alignment marks to be observed. More specifically, the position of the target alignment mark in the group is known. For this reason, when the group can be observed, the target alignment mark can be identified, and its position can be detected.

Alternatively, when the positions of alignment marks that are present in the visual field of the observation system are detected, the position of the target alignment mark can be calculated on the basis of the number of the detected position detection marks and their detection positions in the visual field.

Such alignment mark identification methods can be applied not only to global alignment but also to die-by-die alignment.

In addition, when alignment marks are observed using the high- and low-magnification systems simultaneously, and the observation result by the low-magnification system indicates that the target alignment mark is present in the visual field of the high-magnification system in an observable state, the first position detection result by the high-magnification system is preferably employed. Otherwise, preferably, the wafer or high-magnification system is moved on the basis of the observation result by the low-magnification system to move the target alignment mark into the visual field of the high-magnification system, and the position of the target alignment mark is detected at a high accuracy. Accordingly, alignment such as global alignment can be executed at a high speed, and a high throughput can be achieved.

According to the present invention, for example, a target position detection mark can be identified from a plurality of position detection marks, or the position of a target position detection mark in a plurality of position detection marks can be calculated.

As many apparently widely different embodiments of the present invention can be made without departing from the spirit and scope thereof, it is to be understood that the invention is not limited to the specific embodiments thereof except as defined in the appended claims.

What is claimed is:

1. An apparatus for detecting a position of a target mark included in an object, said apparatus comprising:

a unit which senses an image of the object, the object having a plurality of marks including the target mark with respect to each unit region of the object, the target mark being used for specifying a position of a corresponding unit region, each of the plurality of marks comprising a first mark and a feature of a region outside of the first mark, the feature corresponding to a structure previously formed on the object for identifying a positional relationship between the first mark and the target mark;

a unit which extracts the first mark and the feature in an image sensed by said sensing unit; and a unit which detects a position of the target mark based on a position of the first mark and the feature.

2. An apparatus according to claim 1, wherein the feature corresponds to an auxiliary mark associated with the first mark.

3. An apparatus according to claim 2, wherein the plurality of the first marks have different auxiliary marks, respectively.

4. An apparatus according to claim 2, wherein the auxiliary mark is connected to the first mark.

5. An apparatus according to claim 2, wherein the auxiliary mark is surrounded by the first mark.

6. An apparatus according to claim 1, wherein the feature corresponds to relative positions of the plurality of the first marks.

7. An apparatus according to claim 1, wherein the feature corresponds to a position of the first mark relative to the target mark.

8. An apparatus according to claim 1, wherein the object is a substrate on which a device is to be formed.

9. An apparatus according to claim 8, further comprising a stage unit which positions the substrate.

10. An apparatus according to claim 9, further comprising a unit which controls positioning of the substrate by said stage unit based on the position of the target mark detected by said detecting unit.

11. An apparatus for exposing a substrate to radiant energy, said apparatus comprising:

a stage unit which positions the substrate;

a unit which senses an image of the substrate, the substrate having a plurality of marks including a target mark with respect to each unit region of the substrate, the target mark being used for specifying a position of a corresponding unit region, each of the plurality of marks comprising a first mark and a feature of a region outside of the first mark, the feature corresponding to a structure previously formed on the substrate for identifying a positional relationship between the first mark and the target mark;

a unit which extracts the first mark and the feature in an image sensed by said sensing unit;

a unit which detects a position of the target mark based on a position of the first mark and the feature; and a unit which controls said stage unit so as to position the substrate based on the position of the target mark.

12. A method of detecting a position of a target mark included in an object, said method comprising steps of:

sensing an image of the object, the object having a plurality of marks including the target mark with respect to each unit region of the object, the target mark being used for specifying a position of a corresponding unit region, each of the plurality of marks comprising a first mark and a feature of a region outside of the first mark, the feature corresponding to a structure previously formed on the object for identifying a positional relationship between the first mark and the target mark;

extracting the first mark and the feature in an image sensed in said sensing step; and detecting a position of the target mark based on a position of the first mark and the feature.

13. A method of manufacturing a device, said method comprising steps of:

sensing an image of a substrate;, the substrate having a plurality of marks including a target mark with respect to each unit region of the substrate, the target mark being used for specifying a position of a corresponding unit region, each of the plurality of marks comprising a first mark and a feature of a region outside of the first mark, the feature corresponding to a structure previously formed on the substrate for identifying a positional relationship between the first mark and the target mark;

extracting the first mark and the feature in an image sensed in said sensing step;

detecting a position of the target mark based on a position of the first mark and the feature; and transferring a pattern concerning the device to the substrate based on the position of the target mark.

* * * * *

UNITED STATES PATENT AND TRADEMARK OFFICE
CERTIFICATE OF CORRECTION

PATENT NO. : 6,949,755 B2
DATED : September 27, 2005
INVENTOR(S) : Hiroshi Tanaka It is certified that error appears in the above-identified patent and that said Letters Patent is hereby corrected as shown below:

Column 5,
Line 13, "petition" should read -- position --.
Line 56, "signal.)" should read -- signal) --.

Column 7,
Lines 27 and 31, "NI," should read -- N1, --.
Line 41, "CPC," should read -- CPc, --.

Column 8,
Line 10, "discriminately" should read -- discriminating --.
Line 11, "with" should read -- with reference --.

Column 10,
Line 54, "step" should read -- steps --.

Column 15,
Line 36, "X Ny" should read -- × Ny --.

Column 16,
Line 3, "$Y_{1y}$" should read -- $Y_{1j}$ --.

Column 22,
Line 32, "substrate;," should read -- substrate, --.

Signed and Sealed this

Twenty-eighth Day of February, 2006

JON W. DUDAS
*Director of the United States Patent and Trademark Office*